(12) United States Patent
Watanabe et al.

(10) Patent No.: US 12,391,472 B2
(45) Date of Patent: Aug. 19, 2025

(54) SUBSTRATE PROCESSING APPARATUS AND SUBSTRATE PROCESSING METHOD

(71) Applicant: Tokyo Electron Limited, Tokyo (JP)

(72) Inventors: Tsuyoshi Watanabe, Koshi (JP); Masashi Tsuchiyama, Koshi (JP); Naruaki Iida, Koshi (JP); Suguru Enokida, Koshi (JP); Kousei Ide, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 211 days.

(21) Appl. No.: 17/957,077

(22) Filed: Sep. 30, 2022

(65) Prior Publication Data

US 2023/0106927 A1    Apr. 6, 2023

(30) Foreign Application Priority Data

Oct. 4, 2021    (JP) .................. 2021-163665

(51) Int. Cl.
*B65G 1/04* (2006.01)
*B65G 47/24* (2006.01)
*B65G 49/06* (2006.01)

(52) U.S. Cl.
CPC .......... *B65G 1/0407* (2013.01); *B65G 47/24* (2013.01); *B65G 49/061* (2013.01); *B65G 2201/0297* (2013.01)

(58) Field of Classification Search
CPC ......... H01L 21/67769; H01L 21/67733; H01L 21/67745; H01L 21/67178; H01L 21/67736; H01L 21/67184; H01L 21/6773
See application file for complete search history.

(56) References Cited

U.S. PATENT DOCUMENTS

2013/0032179 A1* 2/2013 Kaneko ............ H01L 21/67766
                                                             414/222.01
2013/0112223 A1* 5/2013 Nakaharada ...... H01L 21/67178
                                                             134/61

(Continued)

FOREIGN PATENT DOCUMENTS

| JP | 2008-258208 A | 10/2008 |
| JP | 201369916 A | 4/2013 |
| JP | 2015-149400 A | 8/2015 |

*Primary Examiner* — Glenn F Myers
(74) *Attorney, Agent, or Firm* — Nath, Goldberg & Meyer; Jerald L. Meyer; Tanya E. Harkins

(57) ABSTRACT

A substrate processing apparatus includes: a carrier block including carrier placement parts and configured to load/unload a substrate into/from a carrier; a processing block provided on one side of the carrier block to process the substrate; first and second carrier placement parts of the carrier placement parts and provided side by side in a front-rear direction in a plan view; substrate placement parts provided to be arranged step by step vertically on one side of a substrate transfer region formed between the first and second carrier placement parts; a first substrate transfer mechanism provided in the substrate transfer region to deliver the substrate between the carrier of the first carrier placement part and a first substrate placement part of the substrate placement parts; and a second substrate transfer mechanism for moving upward and downward so as to deliver the substrate between first and second substrate placement parts.

20 Claims, 17 Drawing Sheets

(56) References Cited

U.S. PATENT DOCUMENTS

2013/0272824 A1\* 10/2013 Iida ...................... H01L 21/677
                                                                  414/222.01
2016/0300734 A1\* 10/2016 Amano ............... H01L 21/6838
2020/0098607 A1\* 3/2020 Kuwahara ......... H01L 21/67733

\* cited by examiner

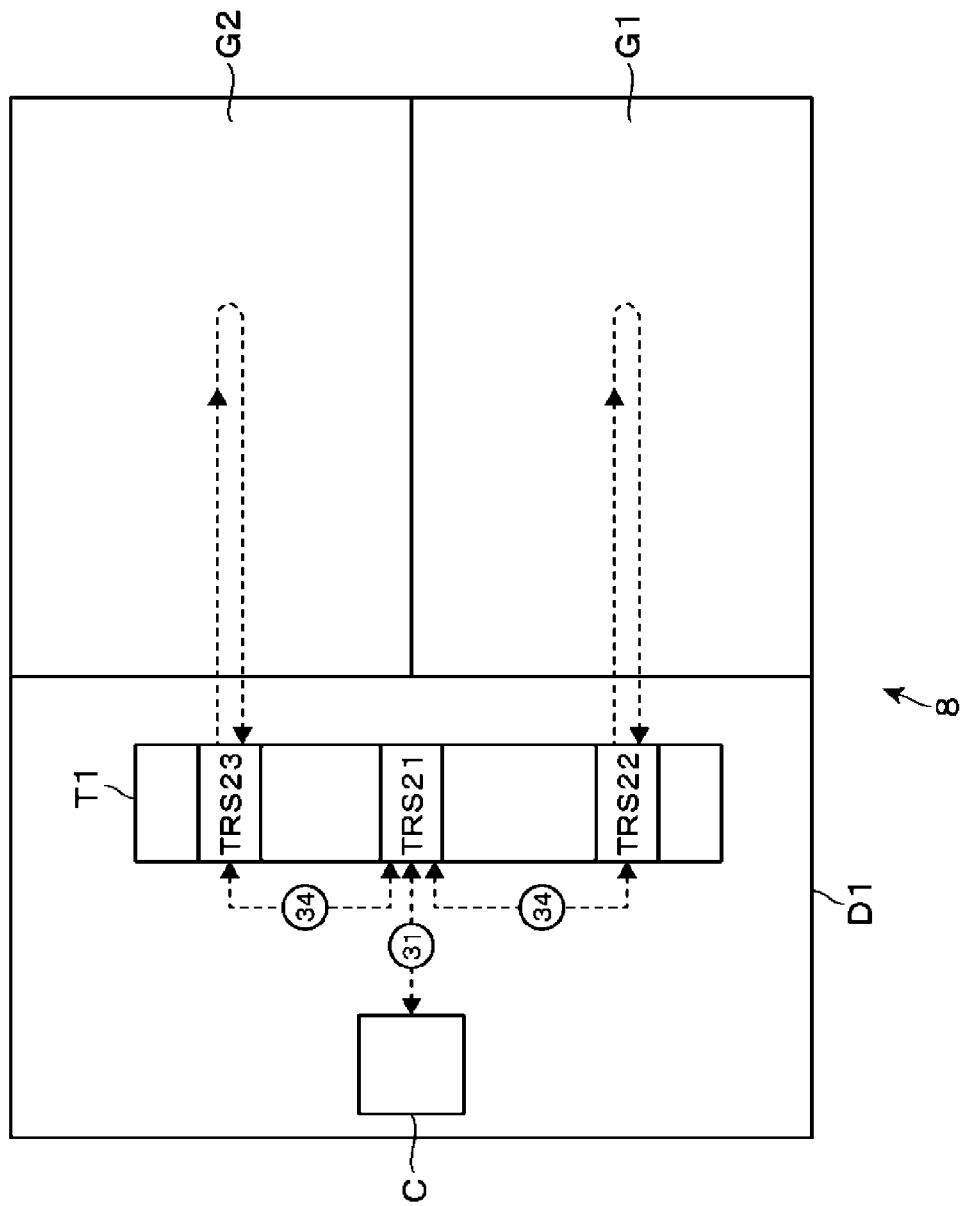

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2021-163665, filed on Oct. 4, 2021, the entire contents of which are incorporated herein by reference.

TECHNICAL FIELD

The present disclosure relates to a substrate processing apparatus and a substrate processing method.

BACKGROUND

In a semiconductor device manufacturing process, processes such as a liquid process and a heating process are performed on a semiconductor wafer (hereinafter referred to as a "wafer") which is transferred between various processing modules inside a substrate processing apparatus. The wafer is transferred to the substrate processing apparatus by a carrier. Patent Document 1 discloses a substrate processing apparatus including a carrier block for delivering and receiving a wafer to and from a carrier. This carrier block is provided with two transfer mechanisms between which a stack including a plurality of substrate placement parts is sandwiched. Each of the two transfer mechanism includes a holder for delivering the wafer to and from the placement parts, and a holder for delivering the wafer to and from the carrier.

PRIOR ART DOCUMENTS

Patent Documents

Patent Document 1: Japanese Laid-Open Publication No. 2013-069916

SUMMARY

According to one embodiment of the present disclosure, there is provided a substrate processing apparatus including: a carrier block including a plurality of carrier placement parts on each of which a carrier configured to receive a substrate is placed to perform a loading/unloading of the substrate with respect to the carrier; a processing block provided on one of left and right sides of the carrier block to process the substrate; a first carrier placement part and a second carrier placement part included in the plurality of carrier placement parts and provided side by side in a front-rear direction in a plan view, wherein at least one of the first carrier placement part or the second carrier placement part is at least one substrate loading/unloading carrier placement part; a plurality of substrate placement parts provided to be arranged step by step in a vertical direction on one of left and right sides of a substrate transfer region formed between the first carrier placement part and the second carrier placement part in the plan view, wherein the substrate is placed on each of the plurality of substrate placement parts; a first substrate transfer mechanism provided in the substrate transfer region and configured to rotate around a vertical axis so as to deliver the substrate between the carrier of the first carrier placement part and a first substrate placement part included in the plurality of substrate placement parts; and a second substrate transfer mechanism configured to move upward and downward so as to deliver the substrate between the first substrate placement part and a second substrate placement part included in the plurality of substrate placement parts, wherein the substrate is placed on the second substrate placement part to be delivered to the processing block.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 18 is a schematic front view illustrating another configuration example of the substrate processing apparatus.

DETAILED DESCRIPTION

Figure 1:
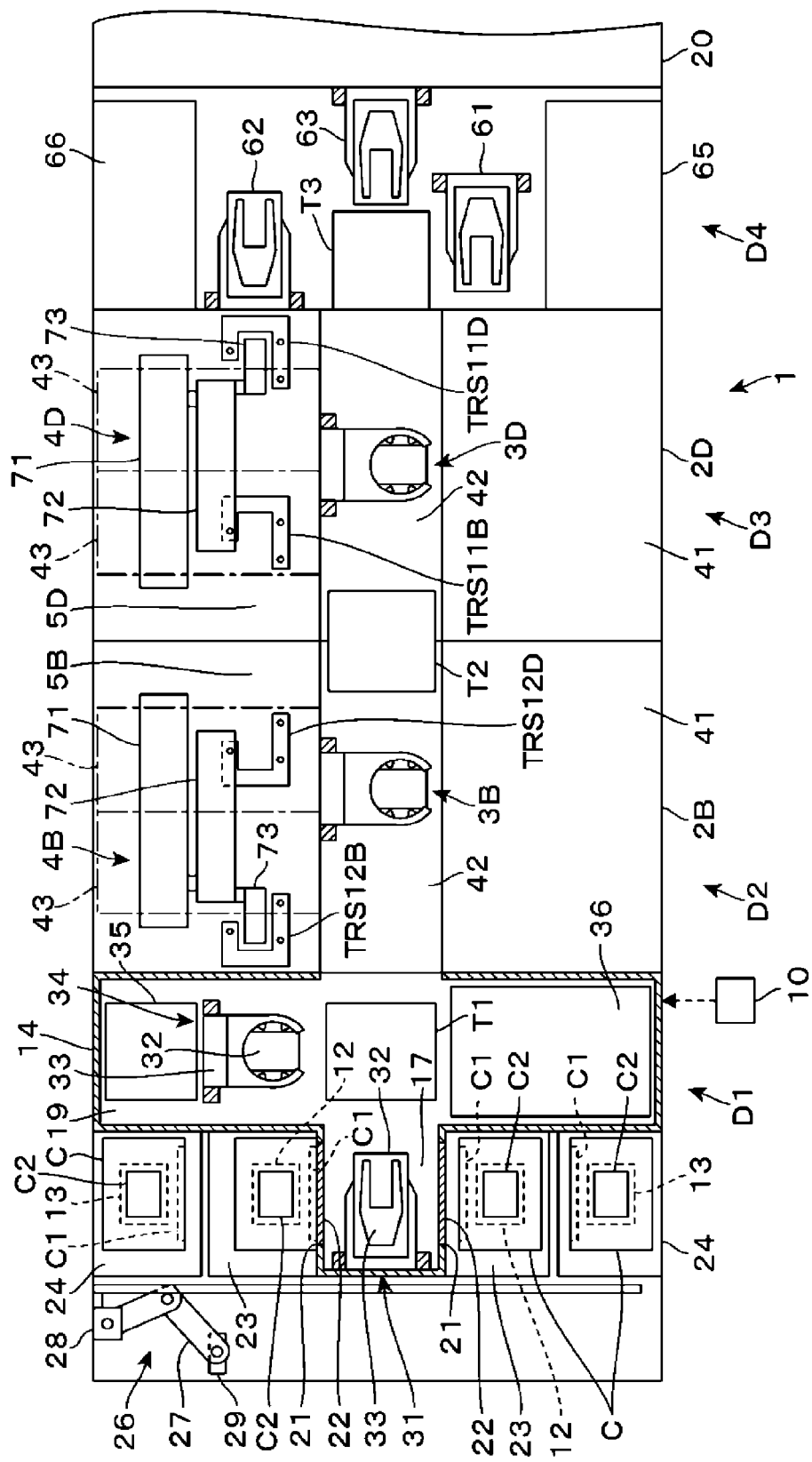
FIG. 1 is a horizontal cross-sectional plan view of a coating/developing apparatus according to an embodiment of a substrate processing apparatus of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A coating/developing apparatus 1 according to an embodiment of the substrate processing apparatus of the present disclosure will be described with reference to each of a cross-sectional plan view of FIG. 1 and a vertical cross-sectional front view of FIG. 2. In the coating/developing apparatus 1, a carrier block D1, a first stacked processing block D2, a second stacked processing block D3, and an interface block D4 are arranged linearly in a horizontal direction in this order. In addition, adjacent ones of these blocks (the carrier block, the first and second stacked processing blocks, and the interface block) D1 to D4 are connected to each other. These blocks D1 to D4 are separated from each other by respective housings. A transfer region for wafers W, which are circular substrates, is formed inside each housing.

The arrangement direction of the blocks D1 to D4 will be referred to as a "left-right direction". For the sake of convenience in description, a side of the carrier block D1 will be referred to as a "left side", and a side of the interface block D4 will be referred to as a "right side". In addition, when the carrier block D1 is viewed as the left with respect to a front-rear direction of the apparatus, the near side will be referred to as a "front side" and the deep side will be referred to as a "rear side". An exposure machine 20 is connected to the interface block D4 from the right side. In each figure, the arrangement direction of the blocks D1 to D4 (the left to right direction) is indicated as an X direction in each figure, and the front-rear direction is indicated as a Y direction. The X direction and the Y direction are linear directions which are orthogonal to each other.

Before explaining each of the blocks D1 to D4 in detail, a schematic configuration of the coating/developing apparatus 1 will be described. A wafer W is transferred to the coating/developing apparatus 1 in a state of being stored in a carrier C called, for example, a front opening unify pod (FOUP). Each of the first stacked processing block D2 and the second stacked processing block D3 are partitioned to be divided into two in the vertical direction. Each Partitioned block constitutes a processing block including a processing module (first processing module) and a main transfer mechanism capable of delivering the wafer W to and from the processing module. A lower side and an upper side of the first stacked processing block D2 partitioned into two blocks as described above will be referred to as a "processing block 2A" and a "processing block 2B", respectively. A lower side and an upper side of the second stacked processing block D3 partitioned into two blocks will be referred to as a "processing block 2C" and a "processing block 2D", respectively.

Since the processing blocks 2A and 2C are adjacent to each other, these processing blocks 2A and 2C may be collectively referred to as "lower processing blocks". In addition, since the processing blocks 2B and 2D are adjacent to each other, these processing blocks 2B and 2D may be collectively referred to as "upper processing blocks". FIG. 1 illustrates these upper processing blocks. Each of the upper processing blocks 2B and 2D is provided with a transfer mechanism (a bypass transfer mechanism) different from the main transfer mechanism. Hereinafter, the different transfer mechanism will be referred to as a "shuttle". The shuttle transfers the wafer W toward the block on the downstream side of a transfer route without passing through a processing module.

The lower processing blocks form a forward route for transferring the wafer W from the carrier block D1 toward the interface block D4. A coating film such as a resist film is formed on the wafer W in the forward route. The upper processing blocks form a rearward route for transferring the wafer W, which has been exposed by the exposure machine 20, from the interface block D4 to the carrier block D1. In the rearward route, the wafer W is transferred to a processing module by the main transfer mechanism in one of the processing blocks 2B and 2D and processed, and in the other processing block, the wafer W is transferred by a shuttle. In other words, there are two transfer routes for the rearward route. The wafer W is transferred via one of the two routes. The module is a place in which the wafer W is placed other than the transfer mechanism (including the shuttle). A module that performs a process on the wafer W will be described as a processing module as described above. This process also includes capturing an image for inspection.

Figure 3:
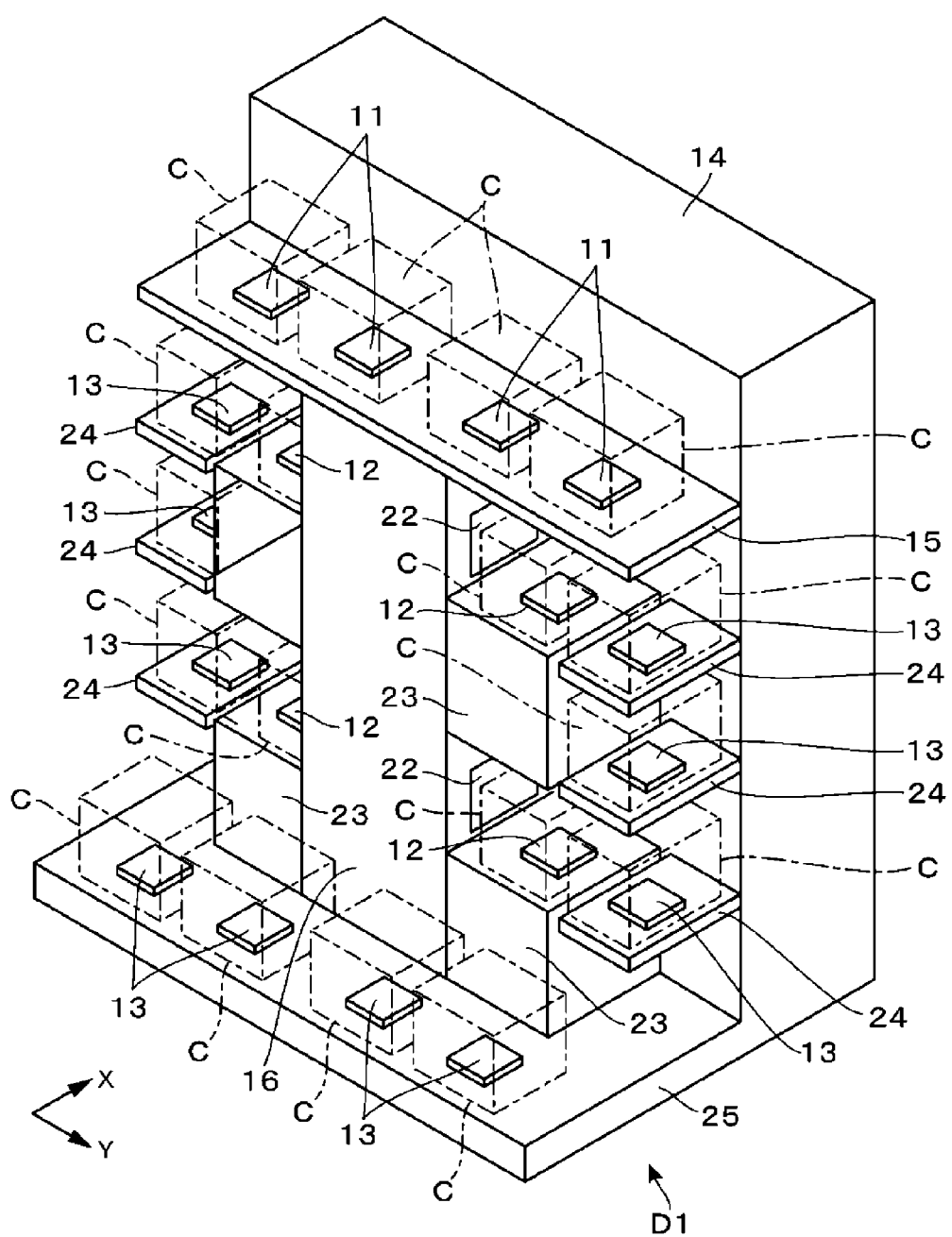
FIG. 3 is a schematic perspective view of a carrier block provided in the coating/developing apparatus.
Figure 4:
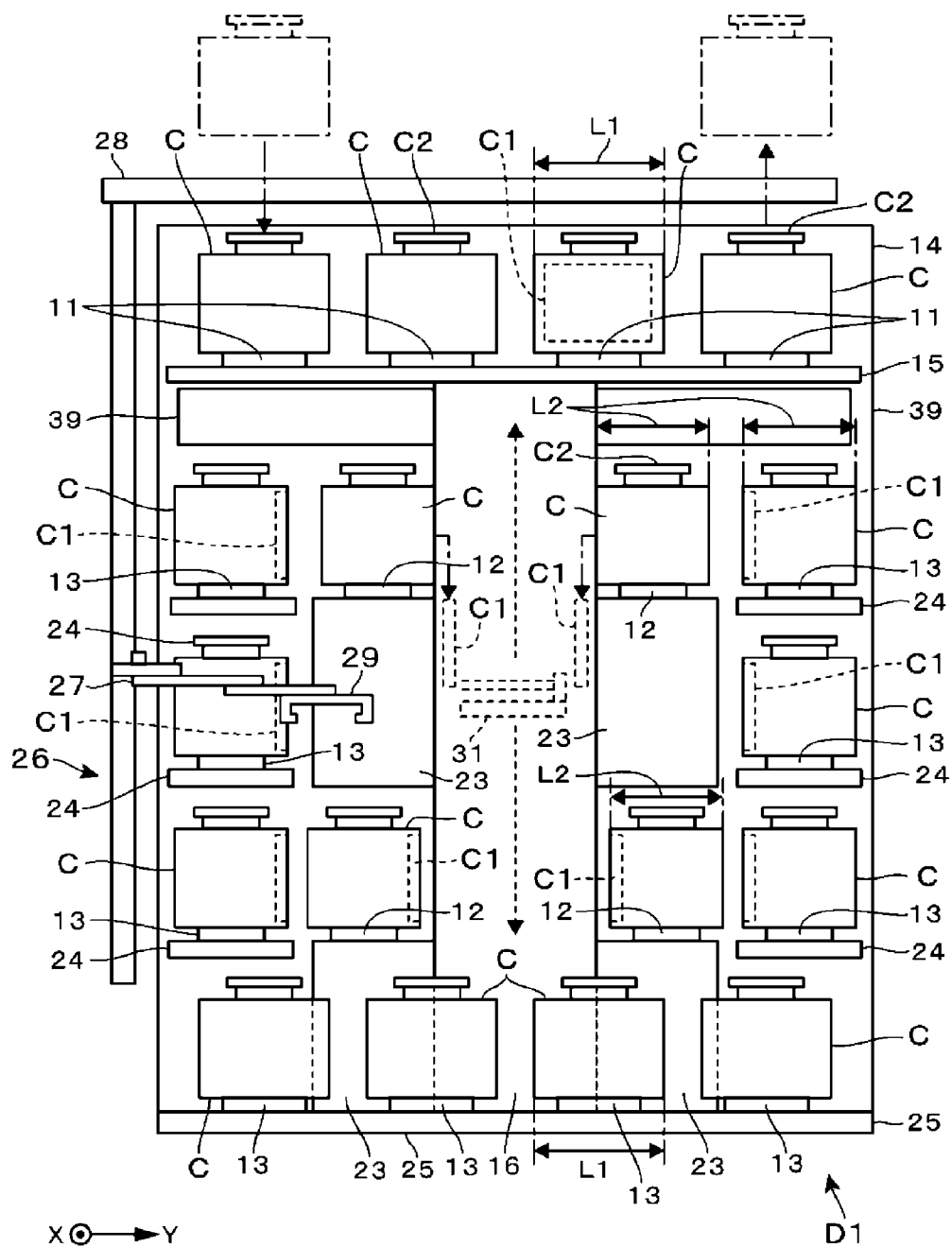
FIG. 4 is a side view of the carrier block.

Hereinafter, the carrier block D1 will be described with reference to a schematic perspective view of FIG. 3 and a side view of FIG. 4. Inside a clean room in which the coating/developing apparatus 1 is installed, a transfer mechanism for carrier C called an overhead hoist transfer (OHT), for example, is provided. By the transfer mechanism (hereinafter, referred to as an "external transfer mechanism"), the carrier C is loaded into and unloaded from the carrier block D1. The carrier block D1 performs the loading/unloading of the wafer W with respect to the carrier C transferred by the external transfer mechanism, and delivers the wafer W between the lower processing blocks and the upper processing blocks.

The carrier C includes a rectangular container main body and a lid C1. The lid C1 is detachable from the container main body, and closes a wafer loading/unloading opening formed in a side surface of the container main body. When viewed in an opening direction of the opening, a left-right width L1 of the carrier C is larger than a front-rear width L2 thereof. In addition, the front, rear, left, and right described in the description of the carrier C do not necessarily correspond to the front, rear, left, and right described in the description of the apparatus. A handle C2 is provided on the top of the container main body of the carrier C. For the sake of avoiding complexity of description, the handles C2 and the lids C1 are omitted in some of the figures, and the lids C1 are indicated only in some of the carriers C in FIG. 4. Since the lids C1 are provided as described above, the lids C1 represent the opening directions of the openings of the carriers C.

In the carrier block D1, each member constituting the carrier block D1 is arranged in a layout that prevents the carrier block D1 from increasing in size. Further, the carrier block D1 is configured to prevent an increase in size when a large number of carriers C having the widths L1 and L2 are placed. The carrier block D1 is provided with three stages 11 to 13 having different roles as carrier placement parts.

The stage 11 constituting a third carrier placement part is a stage to which the above-mentioned external transfer mechanism delivers the carrier C, and will be referred to as an "external delivery stage 11" below. The stage 12 is a stage on which the carrier C is placed for performing the loading (carrying-in) and unloading (carrying-out) of the wafer W with respect to the carrier block D1, and is a carrier placement part for substrate loading/unloading. Since the stage 12 moves for loading and unloading as will be described later, the stage 12 will be referred to as a "moving stage 12" below. The stage 13 is a standby carrier placement part for temporarily retreating and placing the carrier C when it is impossible to transfer the carrier C to the stages 11 and 12 of a transfer destination, and will be referred to as a "retreating stage 13" below. The carrier block D1 includes a rectangular housing 14, and the stages 11 to 13 are provided at the left side of the housing 14 symmetrically with respect to the front-rear center.

The arrangement of the stages 11 to 13 will be described in detail. A loading/unloading shelf 15 is provided above a left vertical (perpendicular) side surface of the housing 14. The loading/unloading shelf 15 is formed from the front end to the rear end of the side surface. In addition, on the loading/unloading shelf 15, four external delivery stages 11 are arranged in the front-rear direction. On each external delivery stage 11, the carrier C is placed to be in a first orientation in which the opening of the carrier C faces the right side (that is, the lid C1 is positioned at the right side) in accordance with an orientation in which the external transfer mechanism transfers the carrier C. For example, the two external delivery stages 11 on the rear side and the two external delivery stages 11 on the front side are used, respectively, as stages for loading carriers C into the carrier block D1 and stages for unloading carriers C from the carrier block D1.

In addition, a front-rear central portion of the left wall of the housing 14 below the loading/unloading shelf 15 is formed to be drawn out and protrude leftward so as to form a vertically elongated rectangular protruding wall portion 16. A region surrounded by the protruding wall portion 16 is configured as a transfer region 17. Two openings 21 for loading/unloading the wafer W are provided on each of the front side surface and the rear side surface of the protruding wall portion 16. The two openings 21 formed in the same side surface are spaced apart from each other in the vertical direction. As a result, a total of four openings 21 are arranged in a 2×2 matrix form when viewed in the left-right direction. The left and right positions of respective openings 21 are the same. Each opening 21 is closed by a door 22 from the inner side of the housing 14.

A lower portion of each opening 21 on the rear side surface of the protruding wall portion 16 protrudes rearward, and a lower portion of each opening 21 on the front side surface of the protruding wall portion 16 protrudes forward, thereby constituting support portions 23, respectively. Therefore, the support portions 23 are also arranged in a 2×2 matrix form when viewed in the left-right direction, and are provided to correspond to the openings 21 and the doors 22, respectively. The moving stages 12 are provided on the support portions 23, and the carriers C are placed on the moving stages 12, respectively, to be in a second orientation in which the openings thereof face the openings 21 in the projecting wall portions 16, respectively. The moving stages 12 provided at one side of the protruding wall portion 16 in the front-rear direction serve as first carrier placement parts, and the moving stages 12 provided on the other side in the front-rear direction serve as second carrier placement parts. The positions of respective moving stages 12 in the left-right direction are aligned with the positions of the external delivery stages 11. Each support portion 23 is provided with a moving mechanism for moving, for example, the moving stage 12 and the door 22 corresponding to the support portion 23.

Each moving stage 12 described above is movable in the front-rear direction between a loading position relatively close to the opening 21 and an unloading position relatively far from the opening 21. The loading position is a position at which the wafer W is loaded into and unloaded from the carrier C, and the unloading position is a position at which the carrier C is delivered to and from a carrier transfer mechanism 26, which will be described later. The door 22 is switchable between holding and non-holding of the lid C1 with respect to the carrier C at the loading position, and is movable to the height of the support portion 23 below the opening 21 in the state of holding the lid C1. Therefore, the door 22 performs attachment/detachment of the lid C1 of the carrier C and opening/closing the door 22.

Three stages of shelves 24 are provided on each of the front side and rear side of the protruding wall portion 16. The shelves 24 on the front side are provided in front of the support portions 23 on the front side, and the shelves 24 on the rear side are provided in rear of the support portions 23 on the rear side. The retreating stage 13 is disposed on each shelf 24. As a result, the retreating stages 13 are positioned in a 2×3 matrix form when viewed in the left-right direction. The carriers C are placed on the retreating stages 13 on the shelves 24 such that the openings are oriented in the left-right direction. More specifically, the openings face the protruding wall portion 16. The positions of respective retreating stages 13 on the shelves 24 in the left-right direction are the same as each other, and are also the same as the positions of the moving stages 12 in the left-right direction.

The carriers C are placed on the uppermost retreating stages 13 at the same height as the carrier C on the moving stage 12 positioned in the upper stage. The carriers C on these stages 12 and 13 are arranged in the front-rear direction. The carriers C are placed on the lowermost retreating stages 13 at the same height as the carriers C on the moving stages 12 positioned in the lower stage. The carriers C on these stages 12 and 13 are arranged in the front-rear direction. On the intermediate retreating stages 13, the carriers C are placed at the same height as the support portions 23 in the upper stage.

In addition, a bottom portion of the left side surface of the housing 14 is drawn out to the left side to form a bottom stage 25. The retreating stages 13 are also provided on the bottom stage 25. The retreating stages 13 on the bottom stage 25 are located in the left side of the retreating stages 13 on the shelves 24. Four retreating stages 13 on the bottom stage 25 are arranged side by side in the front-rear direction. Each carrier C is placed such that the opening of each carrier C faces the left side.

Next, the carrier transfer mechanism 26, which is a carrier transfer mechanism, will be described. The carrier transfer mechanism 26 includes an articulated arm 27 capable of holding the handle C2 of the carrier C, and a moving mechanism 28 capable of moving the articulated arm 27 upward and downward and rearward and forward. Each arm portion of the articulated arm 27 is rotatable around a vertical axis. A distal end portion of the articulated arm 27 is configured as a claw portion 29 that is openable/closable to grip the handle C2 of the carrier C. The claw portion 29 is also rotatable around the vertical axis.

By the carrier transfer mechanism 26, the carrier C is transported (transferred) in the order of: the external delivery stage 11, the moving stage 12 for dispensing the wafer W, the moving stage 12 for recovering the wafer W, and the external delivery stage 11. In transferring the carrier C among respective stages in this way, when a transfer-destination stage is not empty (when the stage is occupied by another carrier C), the carrier C is placed on the retreating stage 13 until the transfer-destination stage becomes empty.

Figure 6:
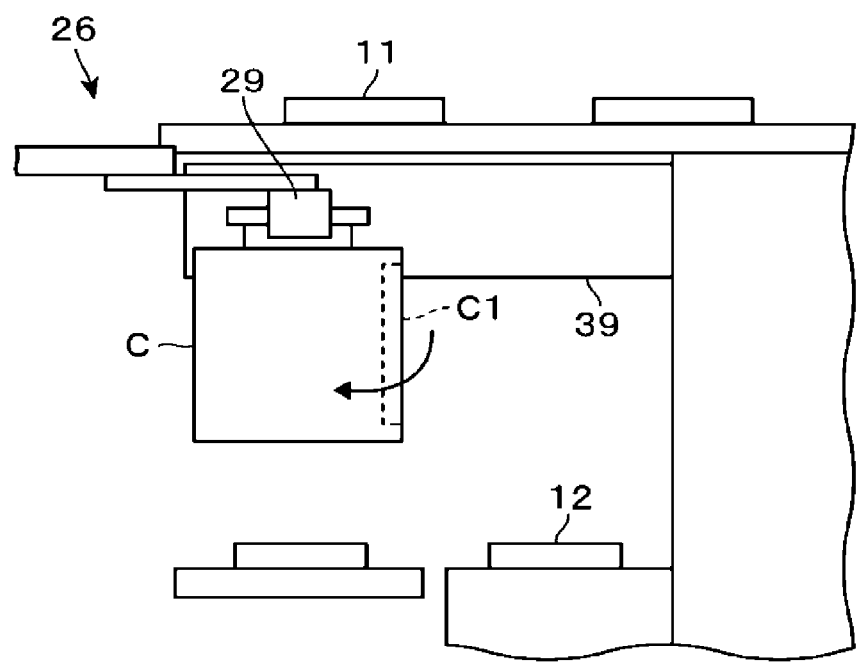
FIG. 6 is an explanatory view illustrating the transfer of the carrier in the carrier block.
Figure 7:
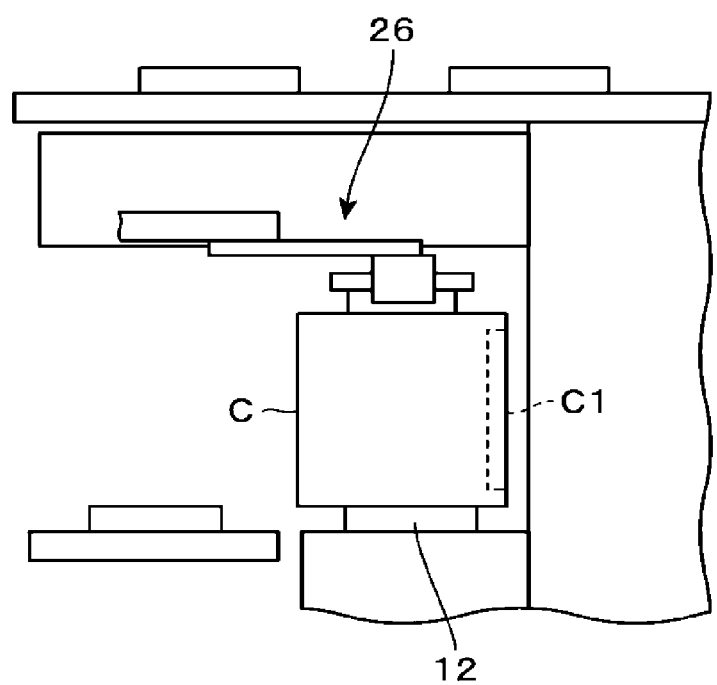
FIG. 7 is an explanatory view illustrating the transfer of the carrier in the carrier block.

The carrier C is placed on each of the stages 11 to 13 in the orientation described above. However, when the orientation of the carrier C differs between a transfer-source stage and the transfer-destination stage, the orientation of the carrier C is changed during transfer. As an example, FIGS. 5 to 7 illustrate an example in which the carrier C is transferred from the external delivery stage 11 to the moving stage 12 on the rear side.

Figure 5:
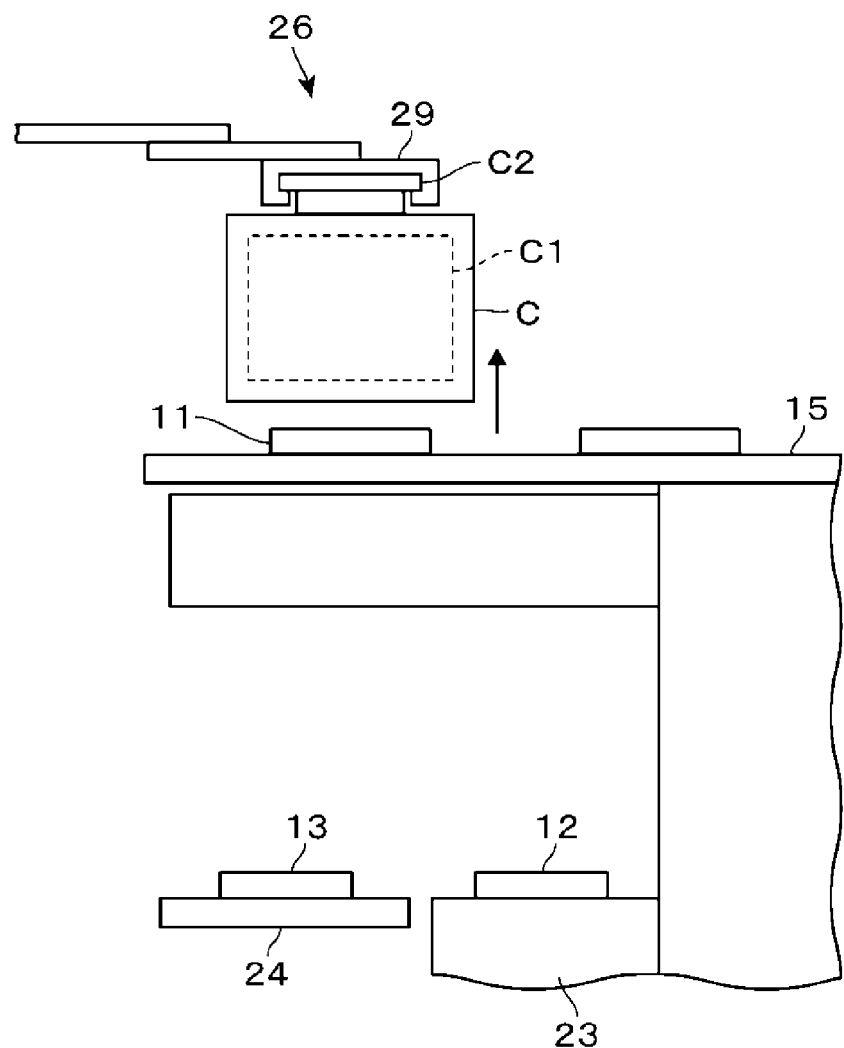
FIG. 5 is an explanatory view illustrating transfer of a carrier in the carrier block.

The claw portion 29 of the carrier transfer mechanism 26 grips the handle C2 of the carrier C on the external delivery stage 11, and the carrier C is separated from the external delivery stage 11 (FIG. 5). Then, while the carrier C is moving toward the moving stage 12, the claw portion 29 of the carrier transfer mechanism 26 is rotated by 90 degrees such that the orientation of the carrier C changes from a state in which the opening is directed rightward to a state in which the opening is directed rearward (FIG. 6), and the carrier C is placed on the moving stage 12 (FIG. 7). Even if the carrier C is transferred between other stages, when the placement direction of the carrier C differs between the transfer-source stage and the transfer-destination stage, the orientation of the carrier changes while the carrier C is being transferred in the transfer route, as in the example illustrated in FIGS. 5 to 7.

Figure 8:
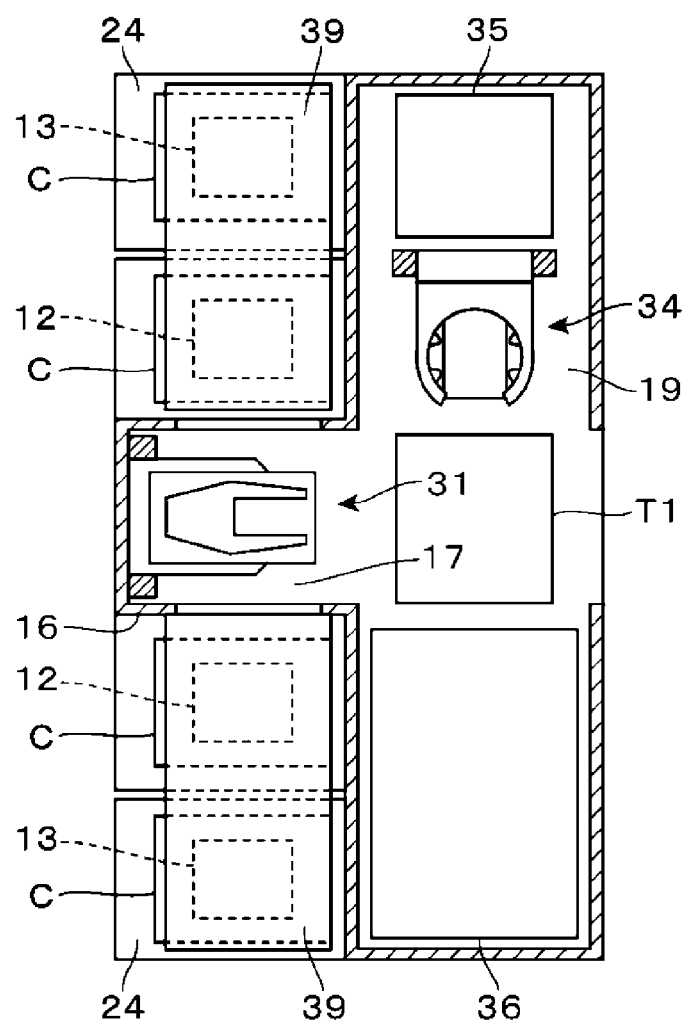
FIG. 8 is a plan view of the carrier block.

The configuration of the carrier block D1 will be described again. Two inspection modules 39 are provided below the loading/unloading shelf 15 and above the region where the carriers C is placed on the retreating stages 13 on the upper stage and the moving stages 12, and arranged in the rear and front sides, respectively, with respect to the protruding wall portion 16. Therefore, as illustrated in FIG. 8, in a plan view, the inspection module 39 on the rear side is arranged to overlap the moving stage 12 on the rear side and the retreating stage 13 on the shelf 24, and the inspection module 39 on the front side is arranged to overlap the moving stage 12 on the front side and the retreating stage 13 on the shelf 24.

Each of the inspection modules 39 has, for example, a housing extending in the front-rear direction. A stage that is movable, for example, in the front-rear direction, and a capturing part equipped with a camera are provided inside the housing. The wafer W, which is placed on the stage and moving, is intermittently captured by the capturing part so that image data of the entire front surface of the wafer W is acquired. A controller 10, which will be described later, determines whether an abnormality occurs in the wafer W based on the image data transmitted from the capturing part. In this example, each inspection module 39 captures an image of the wafer W before being processed by the coating/developing apparatus 1.

Next, an internal configuration of the housing 14 will be described. A space 19 extending linearly in the front-rear direction in a plan view is formed inside the housing 14. That is, the space 19 is formed to extend in the Y direction. The transfer region 17 formed by the protruding wall portion 16 is a space protruding in the XY direction from the central portion of the space 19 in the Y direction. A transfer mechanism 31 that is a first substrate transfer mechanism is provided in the transfer region 17. The transfer mechanism 31 includes a base 32 that is movable upward and downward and rotatable around a perpendicular axis, that is, around the vertical axis, and a holder 33 for the wafer W that is movable forward and rearward relative to the base 32. With this configuration, the transfer mechanism 31 is capable of delivering the wafer W to the carrier C placed on each moving stage 12 and the inspection module 39 described above. That is, the transfer mechanism 31 is shared by these moving stages 12 and inspection modules 39.

Figure 9:
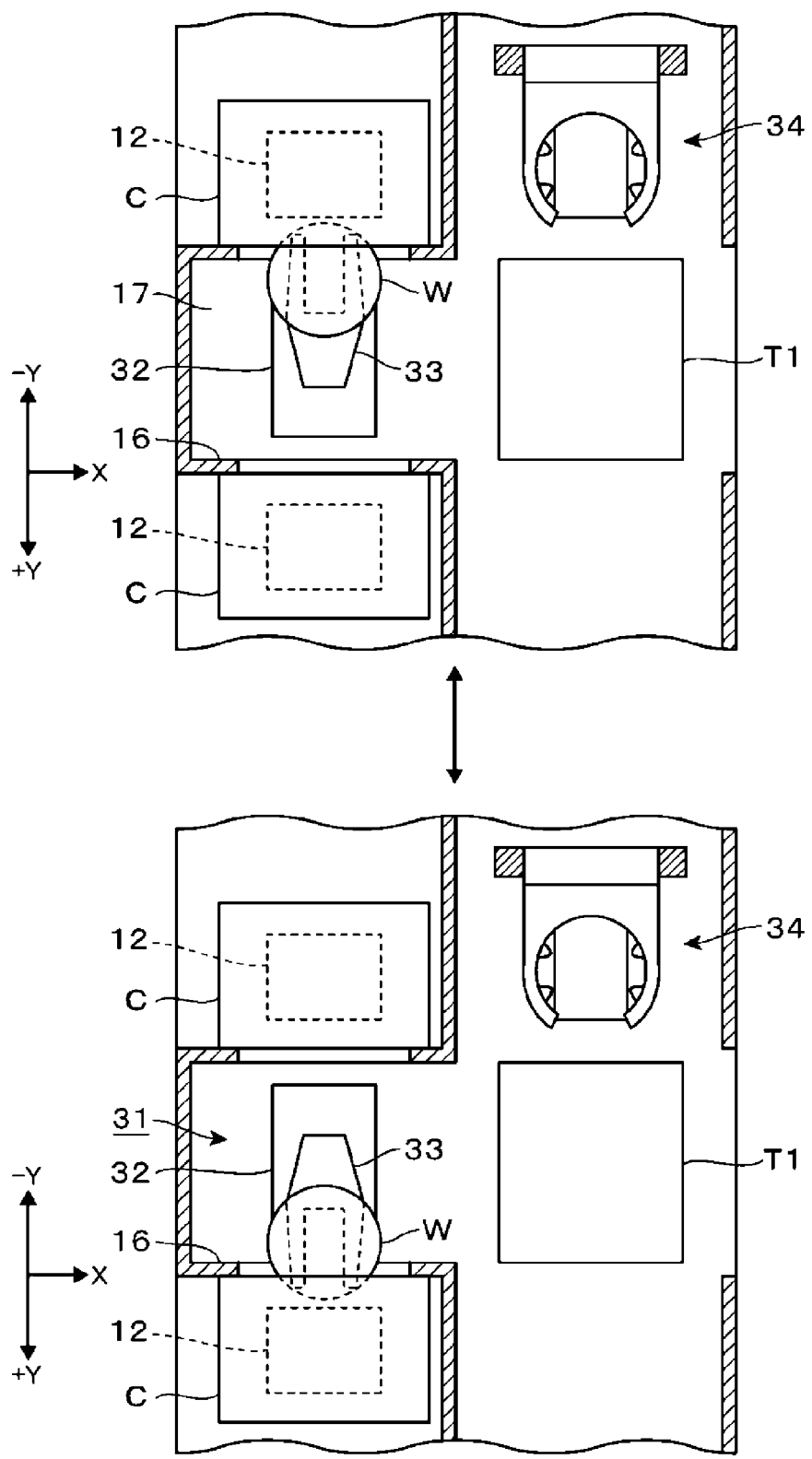
FIG. 9 is an explanatory view illustrating an operation of a transfer mechanism provided in the carrier block.

In FIG. 9, one side of the Y direction is indicated as a −Y side and the other side as a +Y side. When delivering the wafer W to the carrier C of the moving stage 12 on the rear side, the forward direction of the holder 33 is the −Y direction (rearward). When the wafer W is delivered to the carrier C of the moving stage 12 on the front side, the operation of the transfer mechanism 31 is controlled such that the forward direction of the holder 33 is the +Y direction (forward). That is, the holder 33 takes one orientation and the other orientation opposite the one orientation. In addition, even when the wafers W are delivered to the inspection module 39 on the rear side and the inspection module 39 on the front side, respectively, the base 32 is rotated such that the holder 33 takes one orientation and the other orientation.

Next, the space 19 will be described. The space 19 is configured as the wafer transfer region from the central portion to the rear end portion in the extension direction in a plan view. A transfer mechanism and a module are arranged in the space 19. More specifically, a module stack T1 is provided on the right side of the transfer mechanism 31 (that is, one of the left and right sides) in the central portion of the space 19 in the front-rear direction in a plan view. The module stack T1 is configured by overlapping a delivery module TRS on which the wafer W is temporarily disposed (temporarily placed), a temperature adjustment module SCPL for adjusting a temperature of the temporarily-placed wafer W, and the like in the perpendicular direction, that is, in the vertical direction. Other module stacks to be described later have the same configuration.

The transfer mechanism 31 described above delivers the wafer W to the modules constituting the module stack T1. In this case, the orientation of the base 32 is controlled such that the advancing direction of the holder 33 is directed toward this module stack T1 (that is, oriented in the Y direction). A transfer mechanism 34 is provided on the rear side of the module stack T1. The transfer mechanism 34, which is a second substrate transfer mechanism, has the same configuration as the transfer mechanism 31, for example, except that the holder 33 has a different shape.

In addition, at the rear end of the space 19 on the rear side of the transfer mechanism 34, for example, a plurality of hydrophobizing modules 35 are provided in a stacked form. The hydrophobizing module 35, which is a second processing module, is a module that performs a hydrophobizing process by supplying a processing gas to the wafer W before forming a coating film. The wafer W is delivered to the hydrophobizing module 35 by the transfer mechanism 34. The hydrophobizing module 35 includes a hot plate for heating the wafer W placed thereon, and a cover that is capable of being raised and lowered and covers the hot plate. The wafer W is hydrophobized by supplying the processing gas into a closed space formed by the cover above the hot plate.

The temperature adjustment module SCPL is capable of adjusting the temperature of the wafer W. The wafer W is delivered by the raising/lowering operation of the transfer mechanism. The delivery module TRS includes, for example, a plurality of pins arranged in the horizontal direction, and is configured such that the wafer W is delivered to the pins by the raising/lowering operation of the transfer mechanism. The TRS and SCPL, which are substrate placement parts, are provided to form module stacks even in a block other than the carrier block D1. The modules constituting each module stack include a role of delivering the wafer W between blocks.

A shuttle TRS for delivering the wafer W to and from the shuttle is movable upward and downward differently from the above-described configuration, and will be described in detail together with the shuttle. Hereinafter, in order to distinguish SCPLs and TRSs at respective locations from each other, numerals are added after SCPL and TRS. The modules constituting the module stack T1 of the carrier block D1 are indicated as TRS1, TRS2, SCPL1, TRS3, and SCPL2 from bottom to top. In this specification, the term "module stack" refers to modules that are provided to overlap each other in a plan view, and the modules may be spaced apart from each other or may be in contact with each other.

The SCPL1 is located at the height of the lower processing block so as to form a forward route, and the TRS3 and SCPL2 are located at the height of the upper processing block so as to form a rearward route. The TRS1 and TRS2 are used for delivering the wafer W between the transfer mechanisms 31 and 34. In order to transfer the wafer W along transfer routes which will be described later with reference to FIGS. 13 and 14, the transfer mechanism 31 is accessible to the TRS1 and TRS2, and the transfer mechanism 34 is accessible to the TRS1 to TRS3, the SCPL1, and a shuttle TRS12B.

A region on the front side of the space 19 with respect to the module stack T1 and at the height of the lower processing block is configured as a chemical liquid storage region 36. For example, a large number of bottles are arranged vertically and horizontally in the chemical liquid storage region 36. Therefore, the bottles, which are storage parts for a chemical liquid, are provided on the side opposite the side on which the transfer mechanism 34 is provided in the front-rear direction with respect to the module stack T1. Each bottle stores a processing liquid used in the processing block 2A, which will be described later. The details of the processing liquid will be described in the description of the processing block 2A.

Figure 10:
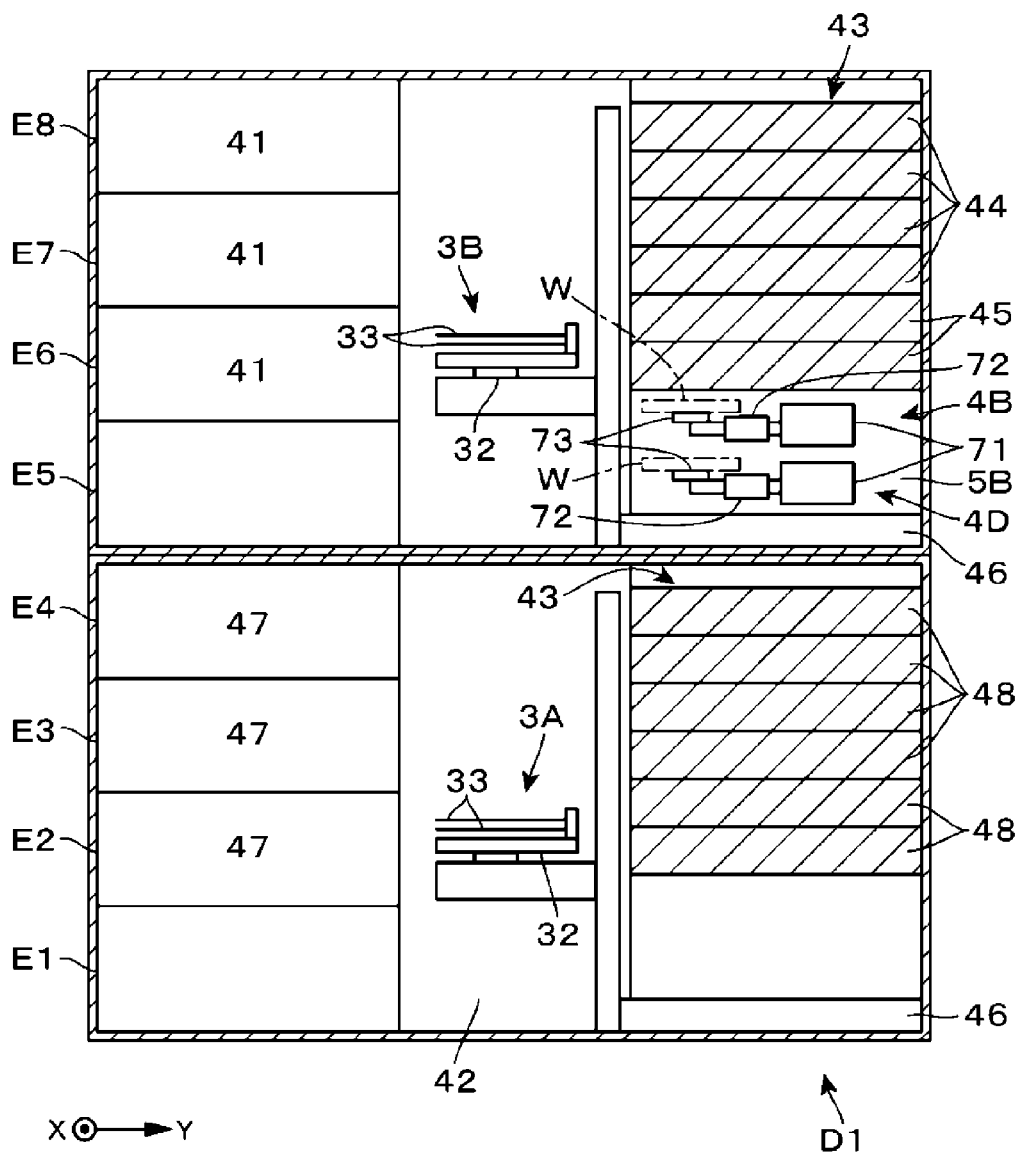
FIG. 10 is a vertical cross-sectional side view of a processing block provided in the coating/developing apparatus.

Next, the first stacked processing block D2 (the processing blocks 2A and 2B) will be described with reference to FIG. 10, which is a vertical cross-sectional side view, as well. The front side of the first stacked processing block D2 is partitioned in the vertical direction to form eight layers. These layers are denoted by "E1" to "E8" from the bottom to the top. The lower layers E1 to E4 are included in the processing block 2A, and the upper layers E5 to E8 are included in the processing block 2B. Each layer is a region in which a liquid processing module is installable.

First, the upper processing block 2B will be described. In this example, developing modules 41 for supplying a developer to the wafer W are provided as liquid processing modules in the layers E6 to E8, respectively. A transfer region 42 for the wafer W is provided on the rear side of the layers E5 to E8. The transfer region 42 is formed linearly from the left end to the right end of the processing block 2B in a plan view, and is provided from the height of the layer E5 to the height of the layer E8. On the rear side of the transfer region 42, processing modules are stacked vertically, for example, in seven stages to form a processing module stack 43. Two processing module stacks 43 are provided at an interval in the left-right direction.

Each of the two processing module stacks 43 includes a heating module 44 which performs a post exposure bake (PEB), and an inspection module 45. The inspection module 45 is the same as the inspection module 39 of the carrier block D1, except that an image acquisition target is the wafer W after processing in the apparatus.

A main transfer mechanism 3B is provided in the transfer region 42. The main transfer mechanism 3B has the same configuration as the transfer mechanism 31, except that the base 32 is connected to a moving mechanism 46 to be also movable in the left-right direction. For example, two holders 33 are provided for each transfer mechanism other than a shuttle in the coating/developing apparatus 1 including the main transfer mechanism 3B, and are capable of advancing and retreating on the base 32 independently of each other. The above-described moving mechanism 46 is provided below the processing module stack 43.

By the main transfer mechanism 3B, the wafer W is delivered to each processing module in the processing block 2B and a module positioned at the same height as that of the processing block 2B in the module stacks (T1, and T2 to be described later) provided in a block adjacent to the processing block 2B. The main transfer mechanism 3B may also deliver the wafer W to a shuttle TRS provided in the processing block 2B.

A partitioned flat space 5B is provided on the lower side of the processing module stack 43. The space 5B is formed from the left end to the right end of the processing block 2B. A shuttle 4B, the shuttle TRS12B and the shuttle TRS12D are provided in the space 5B. The configurations of the shuttle and the shuttle TRSs will be described in detail later.

Each processing block other than the processing block 2B, which will be described later, has substantially the same configuration as that of the processing block 2B, except for the differences that will be described later. Each processing block is provided with a main transfer mechanism corresponding to the main transfer mechanism 3B. For the reference numeral for this main transfer mechanism, instead of "B", the same letter as that given to that of the processing block will be added. Specifically, when the processing block is denoted by "2A", the main transfer mechanism will be denoted by "3A". Other main transfer mechanisms corresponding to the main transfer mechanism 3B are also configured such that the wafer W is capable of being delivered to a processing module and a shuttle TRS inside the processing block provided with the main transfer mechanism, or a module stack inside the processing block or a processing block adjacent to the processing block in the left-right direction.

In addition, as for the reference numeral of a space in which a shuttle can be installed and which corresponds to the above-described space 5B as well, instead of "B", the same English letter as that given to that of the processing block will be added. When a processing block is provided with a shuttle, as the reference numeral of the shuttle, the same English letter as that given to that of the processing block will be added. As for the reference numeral of a shuttle TRS, the same English letter as that given to that of the processing block, which is provided with the shuttle, will be added, wherein a TRS serving as a transfer source and a TRS serving as a transfer destination will be denoted by reference numerals in which "11" and "12" are added in front of English letters, respectively. As for the reference numeral of a wafer transfer path by a shuttle, the same English letter as that given to that of the shuttle will be added after the number "40". As a specific example of the above-described reference numeral rule, a shuttle provided in a processing block 2D to be described later will be denoted by "4D", and the TRS of the transfer source and the TRS of the transfer destination of this shuttle 4D will be denoted by "TRS11D" and "TRS12D", respectively. A wafer transfer path by the shuttle 4D will be denoted by "40D".

Returning to the description of the configurations of the processing blocks, the processing block 2A below the processing block 2B is different from the processing block 2B in that each of the layers E2 to E4 is provided with an antireflection film forming module 47 as a liquid processing module. The antireflection film forming module 47 supplies and applies a chemical liquid for forming an antireflection film from a nozzle onto the front surface of the wafer W to form an antireflection film, which is a coating film. The processing module stack 43 of the processing block 2A is provided with heating modules 48. These heating module 48 have a role different from that of the heating modules 44 of the processing block 2B, and are for removing a solvent in the coating film. The processing block 2A is provided with a transfer region 42 over the height of the layers E1 to E4. The processing block 2A is not provided with a shuttle and a shuttle TRS.

The antireflection film forming module 47 will be further described with reference to FIG. 11. The chemical liquid (processing liquid) for forming the antireflection film is stored in a bottle installed in a chemical liquid storage region 36 of the carrier block D1. The bottle and a nozzle in each antireflection film forming module 47 is connected to each other via a pipe 52. The pipe 52 is provided with a filter 53 for cleaning the chemical liquid flowing toward the nozzle. The filter 53 is installed in the layer E1 of the processing block 2B. As described above, the bottle serving as a chemical liquid source is provided on the front side of the carrier block D1 adjacent to the processing block 2A. The antireflection film forming module 47 is located on the front side with respect to the transfer region 42, and the chemical liquid storage region 36 is located on the front side of the space 19 of the carrier block D1. Therefore, it is possible to make the length of the pipe 52 relatively short, which is advantageous in that it is possible to more reliably suppress the risk of contamination of the antireflection film by particles generated from the pipe 52.

Next, returning back to FIGS. 1 and 2, the second stacked processing block D3 (the processing blocks 2C and 2D) forming each processing block on the right side of the apparatus will be described. The second stacked processing block D3 has substantially the same configuration as the first stacked processing block D2, and thus the differences from the first stacking processing block D2 will be mainly described. First, the upper processing block 2D (another processing block) is the same as the processing block 2B (the one processing block) in terms of the positional relationship of the transfer region 42, the processing module stack 43, the main transfer mechanism, and the space for installing the shuttle stacked on the processing modules. The processing modules installed in the processing block 2D are the same as the processing modules in the processing block 2B. In addition, the shuttle space 5D in the processing block 2D is located at the same height as the space 5B and communicates with the space 5B. The space 5D is provided with a shuttle 4D, a shuttle TRS11B and a shuttle TRS11D.

The lower processing block 2C will be described. The lower processing block 2C is provided with resist film forming modules 49 on the layers E2 to E4. The resist film forming modules 49 have the same configuration as the developing modules 41, except that the former supplies a processing liquid to wafers W instead of a developer. The processing module stack 43 also includes heating modules 48 as in the processing block 2A.

The transfer region 42 of the second stacked processing block D3 is provided with a module stack T2 at the left end thereof. The module stack T2 is located to partially overlap the right end of the transfer region 42 of the first stacking block D2 in a plan view. The module stack T2 includes SCPL4 located at the height of the lower processing block and SCPL3 located at the height of the upper processing block.

Next, the interface block D4 will be described. The interface block D4 includes a module stack T3 provided in the central portion in the front-rear direction. The module stack T3 includes TRS5 to TRS7 and a temperature control module ICPL, which are stacked one above another. The ICPL is a module to which the wafer W is transferred immediately before exposure, is provided on the lower side of the module stack T3, and adjusts a temperature of the placed wafer W in the same manner as the SCPL. In order to transfer the wafer W to a transfer route which will be described, TRS5 and TRS6 are provided at the height of the lower processing block, and TRS7 is provided at the height of the upper processing block. Transfer mechanisms 61, 62, and 63 are provided on the front, rear, and right sides of the module stack T3, respectively. These transfer mechanisms 61 to 63 are configured similarly to the transfer mechanism 31 of the carrier block D1.

In front of the transfer mechanism 61, a plurality of rear surface cleaning modules 65 for supplying a cleaning liquid to the rear surfaces of the wafers W for washing are provided in a stacked form. A plurality of post-exposure cleaning modules 66 for supplying a cleaning liquid to the front surfaces of the wafers W after exposure are provided in a stacked form on the rear side of the transfer mechanism 62. The transfer mechanisms 61 and 62 are capable of transferring the wafers W between the modules constituting the module stack T3. The transfer mechanism 61 and the transfer mechanism 62 is also capable of delivering the wafers W to the rear surface cleaning modules 65 and the post-exposure cleaning modules 66, respectively. The transfer mechanism 63 transfers the wafer W among the ICPL, the TRS6, and the exposure machine 20.

Next, the shuttles 4B and 4D and the shuttle TRS for the shuttles 4B and 4D will now be described. The shuttle 4B carries the wafers W from the processing block 2D to the carrier block D1. As illustrated in FIG. 1, of the shuttle TRS11B and the shuttle TRS12B for the shuttle 4B, the shuttle TRS12B of the transfer destination, is located at the left end of the space 5B so that the wafers W can be delivered to and from the transfer mechanism 34 of the carrier block D1. The shuttle TRS11B of the transfer source is provided at the left end of the space 5D on the right side of the module stack T2 so that the wafers W can be delivered to and from the main transfer mechanism 3D of the processing block 2D.

The shuttle 4D transfers the wafers W from the interface block D4 toward the processing block 2B. Of the shuttle TRS11D and the shuttle TRS12D for the shuttle 4D, the shuttle TRS11D of the transfer source is provided at the right end of the space 5D so that the wafers W can be delivered to and from the transfer mechanism 62 of the interface block D4. The shuttle TRS12D of the transfer destination is provided on the left side of the module stack T2 at the right end of the space 5B so that the wafers W can be delivered to and from the main transfer mechanism 3B of the processing block 2B.

Next, the shuttle 4B, the shuttle TRS11B, and the shuttle TRS12B will be described below with reference to FIG. 12 as well. The shuttle 4B includes a base body 71, an intermediate moving body 72, and a support 73. The base body 71 is configured with a long member extending in the left-right direction, and is provided to be accommodated in the space 5B of the processing block 2B. The intermediate moving body 72 is also a long member extending in the left-right direction, and is connected to the front side of the base body 71. The support 73 is connected to the front side of the intermediate moving body 72 and formed in the shape of an elongated rectangular parallelepiped in the left-right direction. The wafer W is supported on the support 73 and transferred horizontally and linearly in the left-right direction.

The base body 71 allows the intermediate moving body 72 to move in the left-right direction with respect to the base body 71. As the intermediate moving body 72 moves with respect to the base body 71, the support 73 moves in the left-right direction with respect to the intermediate moving body 72. More specifically, as the intermediate moving body 72 moves leftward (toward the carrier block D1), the support 73 moves leftward, and as the intermediate moving body 72 moves rightward (toward the interface block D4), the support 73 moves rightward.

Figure 12:
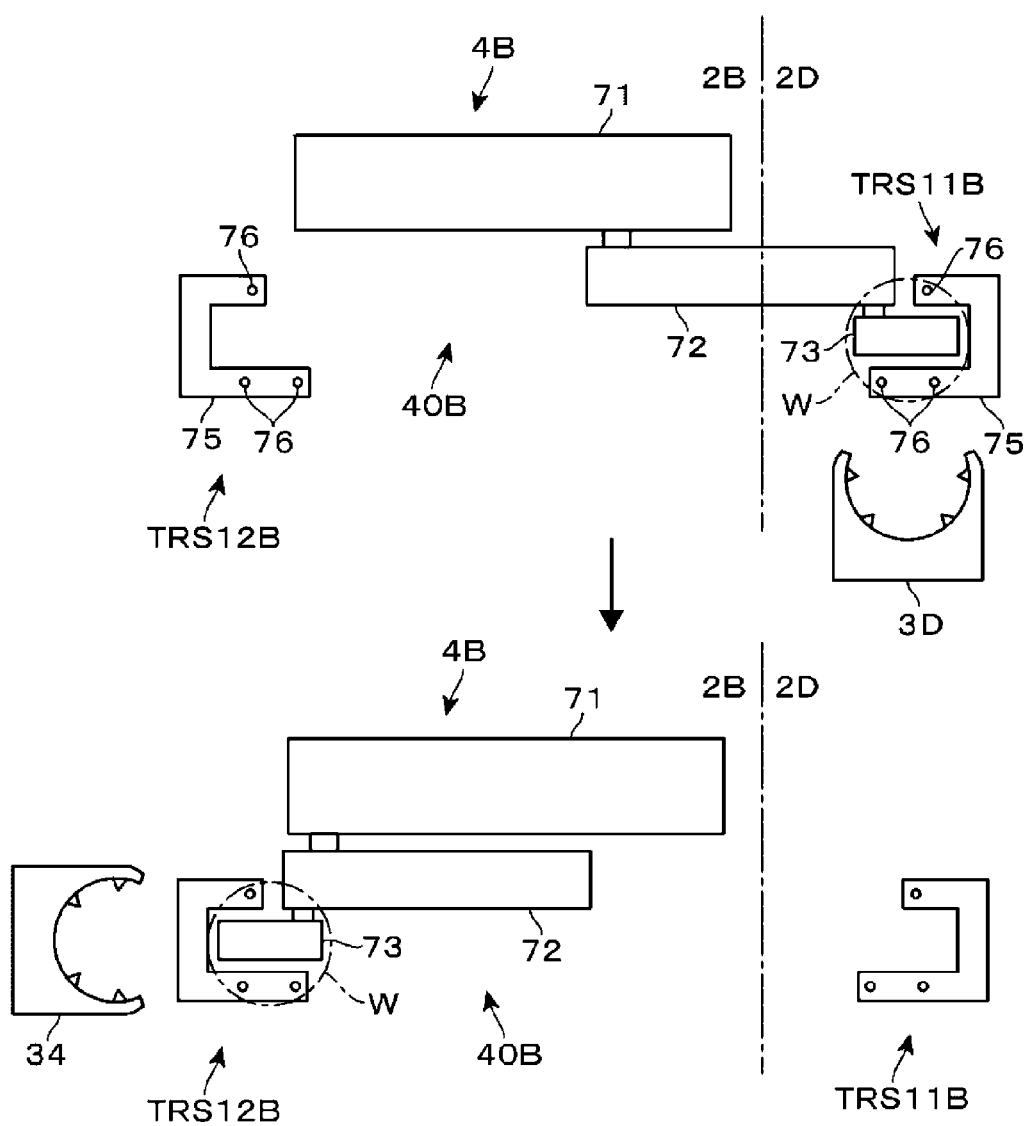
FIG. 12 is a plan view of a shuttle provided in the processing block.

At a position where the support 73 delivers the wafer W to the shuttle TRS11B (the right transfer position), for example, the right end of the support 73 is located on the right side of the right end of the intermediate moving body 72, and the right end of the intermediate moving body 72 is located on the right side of the right end of the base body 71 (see the upper side of FIG. 12). At a position when the support 73 delivers the wafer W to the shuttle TRS12B (the left transfer position), for example, the left end of the support 73 is located on the left side of the left end of the intermediate moving body 72, and the left end of the intermediate moving body 72 is located on the left side of the left end of the base body 71 (see the lower side of FIG. 12).

The shuttle TRS11B includes a support plate 75 provided to form a recess the left side of which is opened in a plan view, three pins 76 protruding upward from the support plate 75, and a lifting mechanism (not illustrated) that raises and lowers the support plate 75. This lifting mechanism is connected to the lower side of the support plate 75 so as not to interfere with the intermediate moving body 72 and the support 73 of the shuttle 4B or the support plate 75. As illustrated at the upper side of FIG. 12, the right end of the support 73 at the right transfer position is in the state of being accommodated in the recess formed by the support plate 75 in a plan view, and the wafer W may be delivered between the support 73 and the shuttle TRS11B by moving the pins 76 upward and downward. The shuttle TRS12B has the same configuration as the shuttle TRS11B except that the support plate 75 is formed to form a recess the right side of which is opened in a plan view. As illustrated at the lower side of FIG. 12, the left end of the support 73 at the left transfer position is in the state of being accommodated in the recess formed by the support plate 75 in a plan view, and the wafer W may be delivered between the support 73 and the shuttle TRS12B by moving the pins 76 upward and downward.

The main transfer mechanism 3D of the processing block 2D delivers the wafer W processed in the processing block 2D onto the pins 76 at the raised position of the shuttle TRS11B. When the pins 76 move to the lowered position and the wafer W is supported by the support 73 at the above-described right transfer position, each of the intermediate moving body 72 and the support 73 moves to the left side, while the pins 76 of the shuttle TRS11B return to the raised position. When the support 73 moves to the above-described left transfer position, the pins 76 at the lowered position of the shuttle TRS12B move to the raised position to support the wafer W. As the support 73 moves toward the right transfer position, the pins 76 return to the lowered position thereof. Thereafter, the transfer mechanism 34 of the carrier block D1 receives the wafer W.

The shuttles 4D, the shuttle TRS11D, and the shuttle TRS12D are configured in the same manner as the shuttle 4B, the shuttle TRS11B, and the shuttle TRS12B, respectively. Briefly, the base body 71 of the shuttle 4D is provided to be accommodated in the space 5D of the processing block 2D. The set of the shuttle 4D, the shuttle TRS11D, and the shuttle TRS12D is provided at a height different from that of the set of the shuttle 4B, the shuttle TRS11B, and the shuttle TRS12B, for example, on the lower side of the set. Positions before and after a wafer transfer path 40B by the shuttle 4B and a wafer transfer path 40D by the shuttle 4D are the same.

To correspond to the position of each of the above-described TRS11B, TRS12B, TRS11D, and TRS12D, the transfer path 40B protrudes to the processing block 2D, and the transfer path 40D protrudes to the processing block 2D. By protruding in this way, the right side of the transfer path 40B and the left side of the transfer path 40D overlap each other in a plan view.

Figure 2:
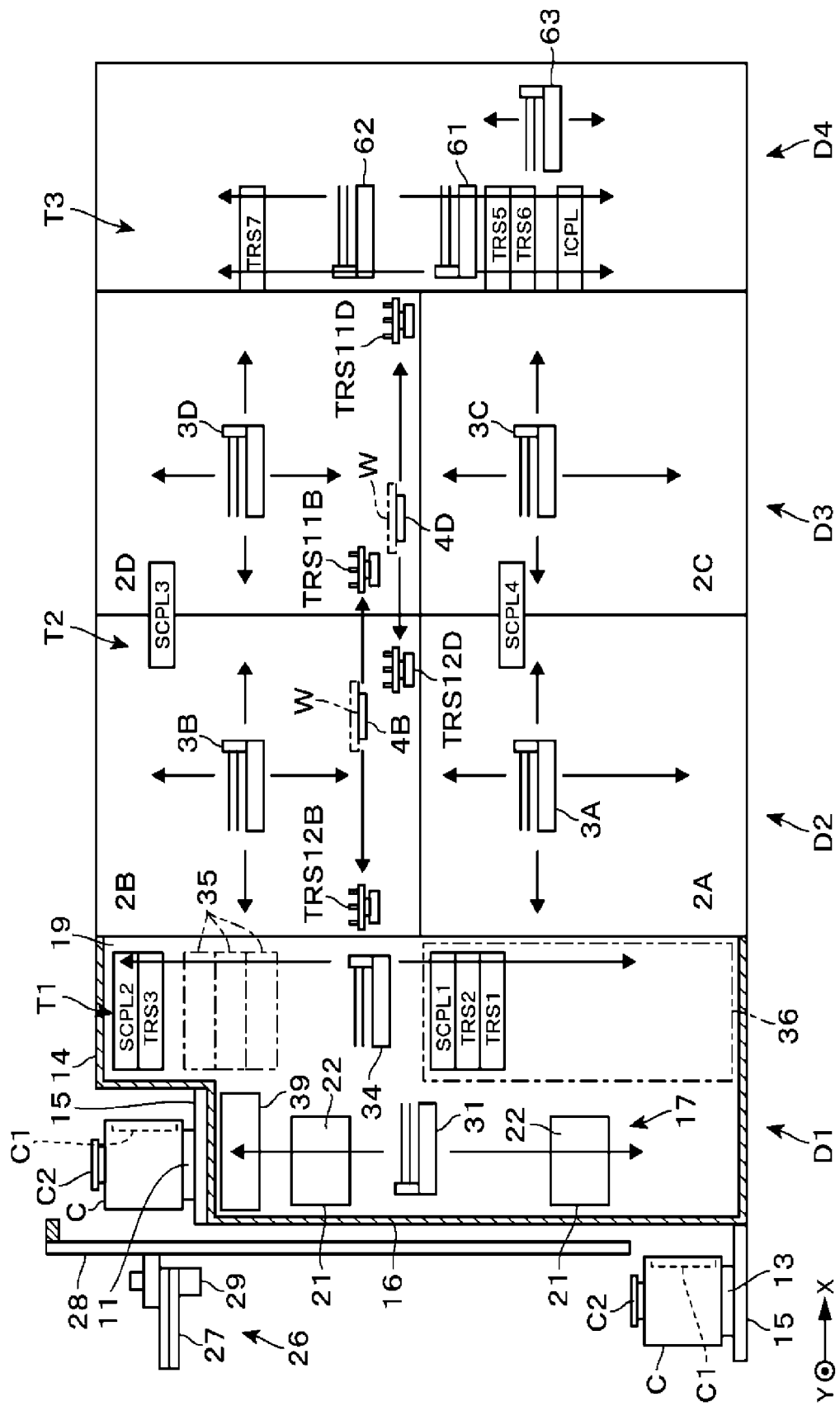
FIG. 2 is a vertical cross-sectional front view of the coating/developing apparatus.

The coating/developing apparatus 1 also includes the controller 10 (see FIG. 1). The controller 10 is configured with a computer, and includes a program, a memory, and a CPU. The program incorporates a group of steps such that a series of operations of the coating/developing apparatus 1 can be implemented. Based on the program, the controller 10 outputs a control signal to each part of the coating/developing apparatus 1 so as to control the operation of each part. Specifically, the operations of the transfer mechanisms 31, 32, 61 to 63, the main transfer mechanisms 3A to 3D, the shuttles 4B and 4D, and each processing module are controlled. As a result, the transfer and processing of the wafer W to be described later are performed. The control of the operation of the processing modules also includes abnormality determination of the wafer W based on the above-described image data. The above-mentioned program is stored in a non-transitory computer-readable storage medium such as a compact disc, a hard disc, or a DVD, and is installed in the controller 10.

Figure 13:
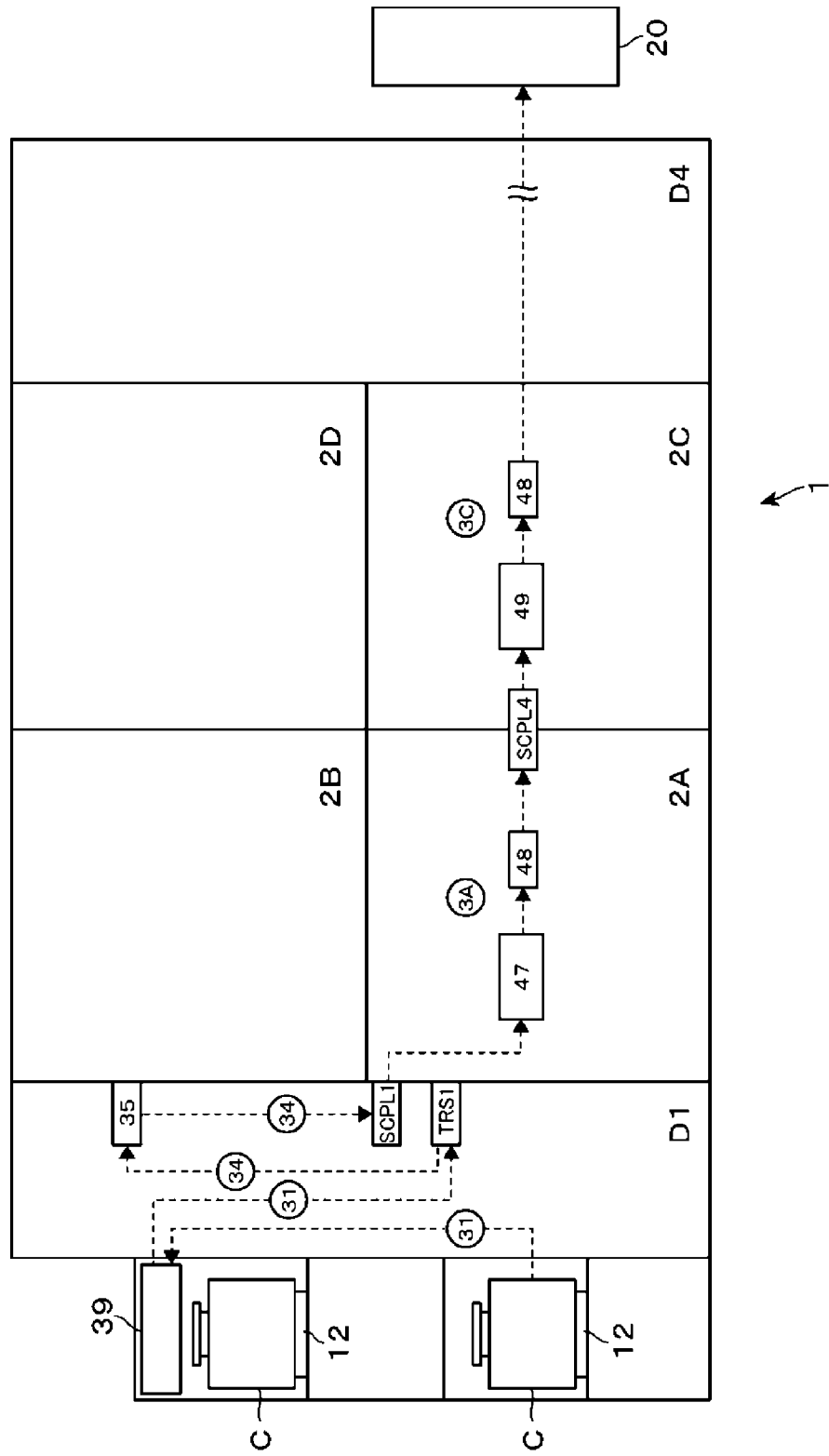
FIG. 13 is an explanatory view illustrating a wafer transfer route in the coating/developing apparatus.
Figure 14:
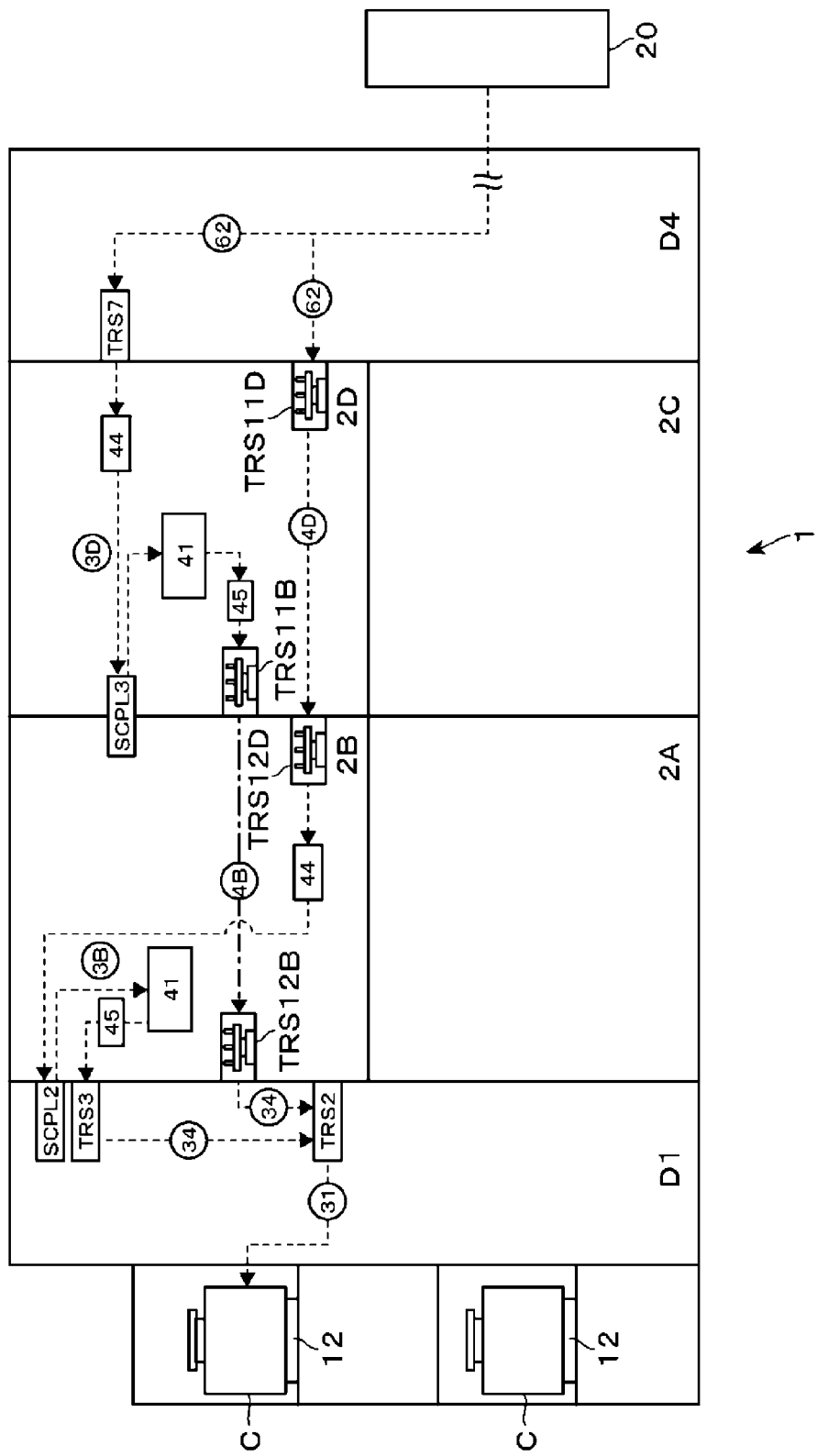
FIG. 14 is an explanatory view illustrating the wafer transfer route in the coating/developing apparatus.

Next, examples of a wafer processing and wafer transfer routes in the coating/developing apparatus 1 will be described with reference to FIGS. 13 and 14 which illustrate the above-described forward route and rearward route, respectively. In FIGS. 13 and 14, above or near some arrows indicating transfer of the wafer W between modules, transfer mechanisms used for the transfer are indicated. In this example, it is assumed that, of four moving stages 12, two lower moving stages 12 are stages (loaders) for dispensing the wafer W, and two upper moving stages 12 are stages (unloaders) for recovering the wafer W.

First, the wafer W is unloaded from the carrier C of the lower moving stage 12 by the transfer mechanism 31 and transferred to the inspection module 39 so that image data is acquired and the presence or absence of an abnormality is determined. Subsequently, the wafer W is transferred in the order of the transfer mechanism 31, the TRS1, the transfer mechanism 34, the hydrophobizing module 35, the transfer mechanism 34, and the SCPL1. After being subjected to the hydrophobizing process, the wafer W is introduced into the processing block 2A by the main transfer mechanism 3A and transferred in the order of the antireflection film forming module 47 and the heating module 48, so that the antireflection film is formed. Thereafter, the wafer W is transferred to the SCPL 4 of the module stack T2, and transferred in the order of the resist film forming module 49 and the heating module 48 by the main transfer mechanism 3C of the processing block 2C, so that a resist film is formed. Thereafter, the wafer W is transferred to the TRS5 of the module stack T3 in the interface block D4.

Thereafter, the wafer W is transferred via the rear surface cleaning module 65 and the ICPL in this order by the transfer mechanism 61 on the front side of the block, and further transferred to the exposure machine 20 by the transfer mechanism 63, so that a resist film on the front surface of the wafer W is exposed along a predetermined pattern. After the exposure, the wafer W is transferred in the order of the transfer mechanism 63, the TRS6, the transfer mechanism 62 on the rear side of the block, the post-exposure cleaning module 66, and the transfer mechanism 62.

The transfer route of the wafer W thereafter is divided into a route for processing in the processing block 2D (referred to as a "first transfer route") and a route for processing in the processing block 2B (referred to as a "second transfer route"). Regarding the first transfer route, the transfer mechanism 62 transfers the wafer W to the TRS7 of the module stack T3, and the wafer W is introduced into the processing block 2D by the main transfer mechanism 3D. Then, as the wafer W is transferred in the order of the heating module 44, the SCPL 3, the developing module 41, and the inspection module 45, a resist pattern is formed thereon and then image data is acquired, so that the presence or absence of an abnormality is determined. Thereafter, as described with reference to FIG. 12, the wafer W is transferred in the order of the main transfer mechanism 3D, the shuttle TRS11B, the shuttle 4B, and the shuttle TRS12B, and subsequently, the transfer mechanism 34 of the carrier block D1 receives the wafer W. The wafer W is transferred in the order of the TRS2 and the transfer mechanism 31 to be stored in the carrier C.

Regarding the second transfer route, the wafer W is transferred in the order of the transfer mechanism 62, the shuttle TRS11D, the shuttle 4D, the TRS12D, and the main transfer mechanism 3B, and introduced into processing block 2B. Then, the wafer W is transferred by the main transfer mechanism 3B in the order of the heating module 44, the SCPL2, the developing module 41, and the inspection module 45. After being subjected to the same processing as the wafer W on the first transfer route, the wafer W is transferred to the TRS3 of the carrier block D1. Subsequently, the wafer W is transferred in the order of the transfer mechanism 34 and the TRS2, and thereafter stored in the carrier C by the transfer mechanism 31 in the same manner as the wafer W on the first transfer route.

Since the transfer is performed as described above, the TRS1 in the module stack T1 is a first substrate placement part to which the wafer W is delivered by the transfer mechanism 31. In addition, the SCPL1, the TRS2, and the TRS3 on which the wafer W is placed so that the wafer W is delivered among the carrier block D1, the lower processing block, and the upper processing block, are second substrate placement parts. Among them, the SCPL1 is a lower substrate placement part corresponding to the lower processing block, and the TRS2 and the TRS3 are upper substrate placement parts corresponding to the upper processing block.

As described above, in the carrier block D1 of the coating/developing apparatus 1, the transfer mechanisms 31 and 34 are disposed at the left side and the rear side, respectively, with respect to the module stack T1 (TRS, SCPL) for delivering the wafer W among the carrier C, the lower processing block, and the upper processing block. The transfer mechanism 31 is disposed in the transfer region 17 formed by providing the protruding wall portion 16 so as to be aligned with the moving stage 12 for loading/unloading of the wafer W in the front-rear direction. The roles of the transfer mechanisms 31 and 34 are separated such that the transfer mechanism 31 performs the delivery of the wafer W to and from the carrier C on the moving stage 12 and the transfer mechanism 34 performs the delivery of the wafer W between the modules of the module stack T1. Since the roles of the transfer mechanisms are separated in this manner, it is possible to increase the throughput of the apparatus by suppressing either the number of operation steps of the transfer mechanisms 31 and 34 (the number of sections in which the transfer mechanisms 31 and 34 perform the transfer operation on the above-described transfer routes) or the moving distances of the transfer mechanisms 31 and 34 in one round of operation step. Due to the above-described layout of the transfer mechanisms 31 and 34, the module stack T1, and the moving stage 12, it is possible to secure a relatively large space on the front side of the module stack T1, and it is possible to use the space as the chemical liquid storage region 36. As a result, the dedicated floor area (footprint) of the coating/developing apparatus 1 is suppressed and an increase in size of the coating/developing apparatus 1 is prevented, which allows the chemical liquid storage region 36 and the liquid processing modules to be located close to each other as described above. Therefore, mixing of particles into the coating film due to the length of the pipe 52 is suppressed, and deterioration in the yield of semiconductor products is suppressed.

In addition, the moving stages 12 are arranged on both the front side and the rear side of the transfer mechanism 31, and the transfer mechanism 31 is accessible to the carrier C on each moving stage 12 through the change of the orientation of the base 32 and the advancing/retracting of the holder 33. With such a configuration, when accessing each carrier C, there is no need to connect the transfer mechanism 31 to a moving mechanism to move the transfer mechanism 31 laterally. Therefore, it is possible to more reliably reduce the footprint, and to improve the throughput. In addition, since such a laterally moving mechanism is not required, it is possible to reduce the manufacturing costs of the apparatus.

In addition, on the front and rear sides of the transfer region 17, a plurality of moving stages 12 are vertically stacked one above another. By providing the moving stages 12 in this way, a sufficient number of moving stages 12 are ensured while making the lateral movement of the base 32 of the transfer mechanism 31 unnecessary. Thus, the transfer mechanism 31 is accessible to the carrier C at desired timing. That is, with this configuration, it is possible to more reliably suppress the footprint of the apparatus, and to suppress the deterioration in throughput.

The orientation of the carrier C when the transfer mechanism 31 accesses the carrier C differs from the orientation of the carrier C placed on the external delivery stage 11 by the external transfer mechanism (OHT). The orientation may be changed, for example, by connecting the moving stage 12 to a rotating mechanism and rotating the moving stage 12 by the rotating mechanism. When such a rotating mechanism is provided, the external transfer mechanism may be configured to directly deliver the carrier C to the moving stage 12. That is, the external delivery stage 11 and the moving stage 12 may be the same as each other.

However, it is preferable to use the carrier transfer mechanism 26 as the orientation changing mechanism as described above, rather than using the rotating mechanism as the orientation changing mechanism. As illustrated in FIGS. 5 to 7, while the carrier transfer mechanism 26 is transferring the carrier C between stages, by using the space for this transfer to change the orientation, there is no need to secure the space required for rotating the carrier C around the moving stage 12. As a result, the increase in the size of the apparatus is suppressed, and the change in orientation and the movement to the transfer-destination stage are performed in parallel, so that a decrease in throughput is prevented, which is preferable.

Then, the carrier C on the retreating stage 13 of the shelf 24 is placed to be arranged in the front-rear direction with respect to the carrier C on the moving stage 12 and the lower support portion 23 of the moving stage 12. Like the carrier C on the moving stage 12, the opening of the carrier C on the retreating stage 13 is also oriented in the front-rear direction. As described above, since the width L1 of the carrier C in the left-right direction of the carrier C is greater than the width L2 in the front-rear direction, the carrier C is arranged with the orientation thereof being changed such that the space occupied by the carrier C in the front-rear direction becomes smaller. Therefore, even if the space on the left side of the carrier block D1 is reduced by the amount of the protruding wall portion 16 provided for installing the transfer mechanism 31, it is possible to dispose a large number of retreating stages 13 while suppressing the increase of the width of the carrier block D1 in the front-rear width. The example shown in FIG. 4 and the like illustrates that respective carriers C are placed on the retreating stages 13 of each shelf 24 on the front side such that the openings of the carriers C are oriented rearward such that, on the retreating stages 13 of each shelf 24 on the rear side, the openings of the carriers C are oriented forward, but the front and rear orientations may be reversed.

By providing a large number of retreating stages 13 in that way, it is possible to retreat unnecessary carriers C from the moving stages 12 at free timing, and to place other carriers C on the moving stages 12 to perform the loading/unloading of the wafers W. Thus, it is possible to efficiently perform this loading/unloading. Therefore, disposing carriers C on the retreating stages 13 having the above-described layout while changing the orientation from that at the time of placement on the external delivery stage 11 as described above contributes to preventing deterioration in throughput of the apparatus while preventing the increase in the size of the carrier block D1 and the increase in footprint of the apparatus.

In addition, since the above-described protruding wall portion 16 is provided, by using the spaces formed on the front and rear sides of the protruding wall portion 16, the inspection modules 39, which have a horizontally long configuration since the internal stages move, are disposed to extend in the front-rear direction from the protruding wall portion and to overlap respective stages 11 to 13. This arrangement prevents the increase in the footprint of the apparatus due to the provision of the inspection modules 39.

In addition, by using the space formed on the rear side of the transfer mechanism 34 that accesses each module of the module stack T1, the hydrophobizing module 35 is arranged as a processing module so that the wafer W is delivered thereto by the transfer mechanism 34. This arrangement of the hydrophobizing module 35 also prevents the expansion of the width of the coating/developing apparatus 1 in the left-right direction.

Instead of the hydrophobizing module 35, another module such as an inspection module 45 may be provided so that the transfer may be performed by the transfer mechanism 34. However, the hydrophobizing module 35 does not have to laterally move a placement part (hot plate) on which the wafer W is placed when performing a process. That is, when a processing module is provided on the rear side of the transfer mechanism 34, in order to prevent the increase in size of the carrier block D1, it is preferable to provide the processing module that performs the process without laterally moving the wafer W placement part as described above.

The arrangement of the hydrophobizing module 35 will be supplementarily described. Airflow forming units are provided in the upper portion of the housing 14 of the carrier block D1, and the upper portion of each of the housings of the first and second stacked processing blocks D2 and D3, and the interface block D4. Each airflow forming unit takes in air from the exterior of the coating/developing apparatus 1 and supplies the air to the wafer transfer path in the block in which the airflow forming unit is provided, thereby forming a downward airflow. Each block is also provided with an exhaust port so as to form the downward airflow.

In the carrier block D1, a vertically long filter is provided on the front side of the module stack T1. The airflow forming unit of the carrier block D1 also supplies air to this filter. The air is supplied toward the rear side of the space 19 from this filter, passes between the modules that constitute the module stack T1 toward the hydrophobizing module 35, and is exhausted through an exhaust port located on the rear side of the module stack T1 and opened at the bottom of the apparatus. By adjusting the balance between an amount of air supplied by the airflow forming unit and an amount of exhausted air in each block, the transfer region 42 of the first stacked processing block D2 is under a higher pressure than that of the space 19 of the carrier block D1. As a result, some of the air supplied to the transfer region 42 flows into the space 19 toward the rear side. The air is also exhausted from the exhaust port on the rear side of the module stack T1.

With the supply of the air from the filter as the gas supply part and the inflow of the air from the transfer region 42 as described above, the processing gas used in the hydrophobizing module 35 is more reliably prevented from flowing into the transfer region 42 of the first stacked processing block D2. When the processing gas flows into the developing module 41 through the transfer region 42 and reacts with the developer, development defects may occur, but the above-described airflow control prevents the occurrence of such defects.

The processing blocks 2B and 2D are provided with the shuttles 4B and 4D, respectively. Then, the shuttles 4B and 4D transfer wafers W to be processed in one of the processing blocks 2B and 2D toward the carrier block D1 such that the processing modules in the other processing block are bypassed. Specifically, via respective TRSs, the shuttle 4B delivers the wafers W to the transfer mechanism 34 of the carrier block D1, and the shuttle 4D delivers the wafers W to the main transfer mechanism 3B of the processing block 2B. By the shuttles 4B and 4D that transfer the wafers W in this way, the load on the main transfer mechanism 3B of the processing block 2B and the main transfer mechanism 3D of the processing block 2D (more specifically, the number of transfer steps required within the blocks) is reduced. As a result, the throughput of the coating/developing apparatus 1 can be further improved.

Instead of capturing and inspecting the wafers W processed by the apparatus by the inspection modules 45 of the processing blocks 2B and 2D, the inspection modules 39 in the carrier block D1 may capture and inspect an image of the processed wafer W. In that case, the wafers W, which have been processed and transferred to the module stack T1, may be transferred to the inspection modules 39 by the transfer mechanism 31 before being returned to the carriers C. In addition, an inspection module may be provided in the processing module stack 43 of the processing block 2A, and the wafers W before processing may be transferred in each processing block to be captured and inspected. Only one of the two inspection modules 39 may be provided in the carrier block D1, or the carrier block D1 may be configured such that these inspection modules 39 are not provided.

As for the four moving stages 12 of the carrier block D1, a stage used as a loader and a stage used as an unloader are different in the above transfer example, but a single moving stage 12 may serve as both a loader and an unloader. Even when a loader and an unloader are used separately, any moving stage may be set at a loader or an unloader without being limited to setting a lower moving stage 12 as a loader and setting an upper moving stage 12 as an unloader as in the above-described example. Since the transfer mechanism 31 is configured to be shared by the four moving stages 12, there is an advantage in that it is easy to perform the application switching of the moving stages 12. Since the orientation of the carriers C on the moving stages 12 and the orientation of the carriers C on the retreating stages 13 of the loading/unloading shelf 15 are the same, the retreating stages 13 may be provided instead of the moving stages 12 on one of the front and rear sides of the transfer region 17.

Figure 15:
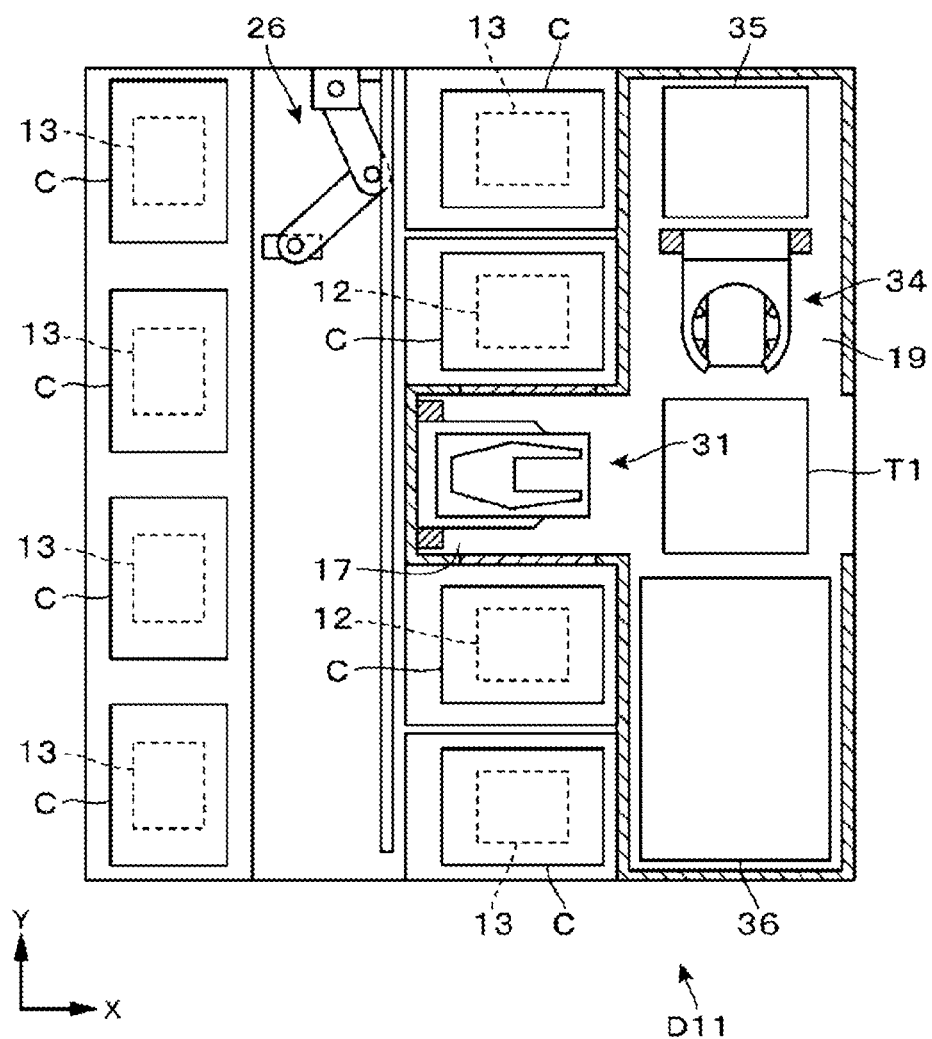
FIG. 15 is a plan view illustrating a modification of the carrier block.
Figure 16:
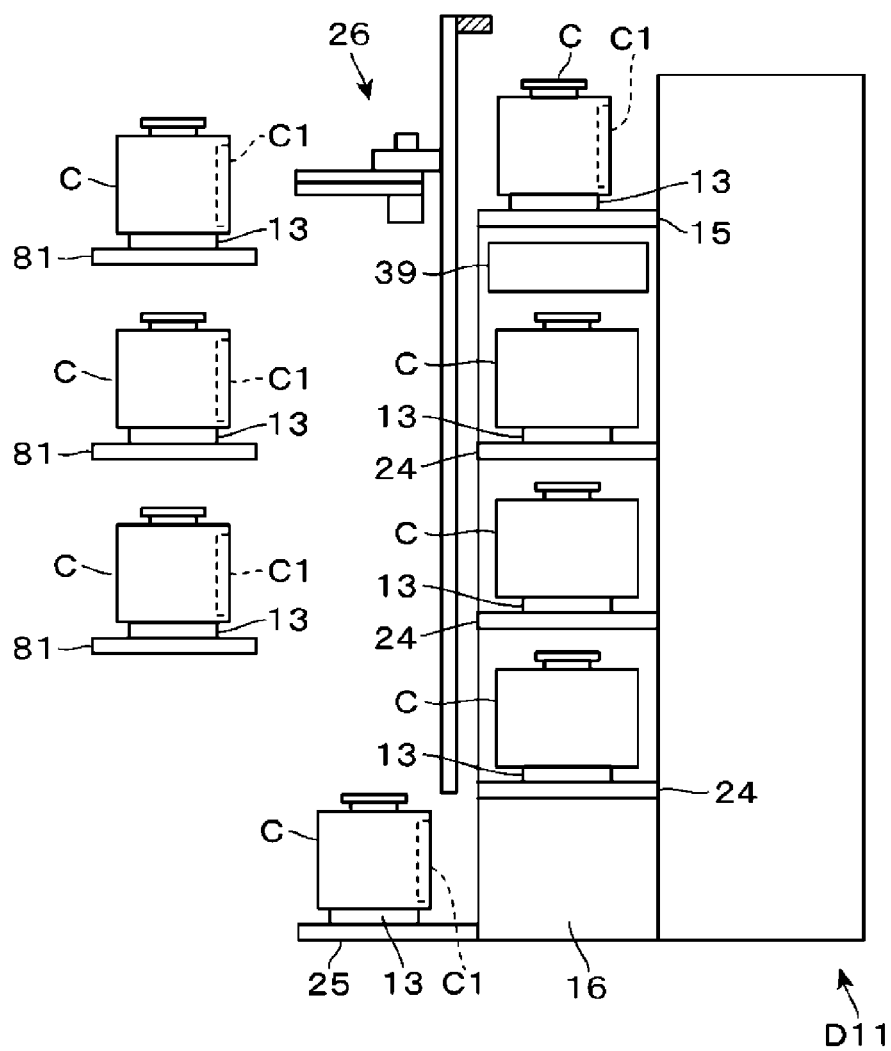
FIG. 16 is a side view of the modification.

The wafers W are stored in the carrier C for each lot. In manufacturing semiconductor devices, there is a tendency to produce various types of products in small quantities. According to this tendency, there is a case where a relatively small number of wafers W are stored in the carrier C and a large number of carriers C are carried into the apparatus to be processed. In such a case, it is advantageous to install a larger number of the above-mentioned retreating stages 13. The plan view of FIG. 15 and the side view of FIG. 16 illustrate a carrier block D11 having such a configuration in which a larger number of retreating stages 13 are installed.

In the carrier block D11, on the shelf 15 on which the external delivery stages 11 are provided in the above-described carrier block D1, retreating stages 13 are provided instead of external delivery stages 11. The carrier block D11 is provided with three stages of shelves 81, which are located to the left side of the retreating stage 13 of a bottom stage 25. On the top shelf 81, four external delivery stages 11 are arranged in the front-rear direction. In addition, on each of the middle shelf 81 and the bottom shelf 81, for example, four retreating stages 13 are arranged in the front-rear direction. The carriers C may be transferred by the carrier transfer mechanism 26 to the stages 11 and 13 of each shelf 81 as well.

In the carrier block D11, carriers C are placed on the retreating stages 13 of the shelf 15 and the middle and bottom shelves 81 in the same orientation as the carriers C on the external delivery stages 11, but may be placed to be oriented in the front-rear direction like the carriers C on the shelves 24. In addition, since the external delivery stages 11 may be provided at positions where the carriers C can be loaded and unloaded by the external transfer mechanism accessed from above the apparatus, the external delivery stages 11 may be provided on the shelf 15 as in the carrier block D1.

Figure 17:
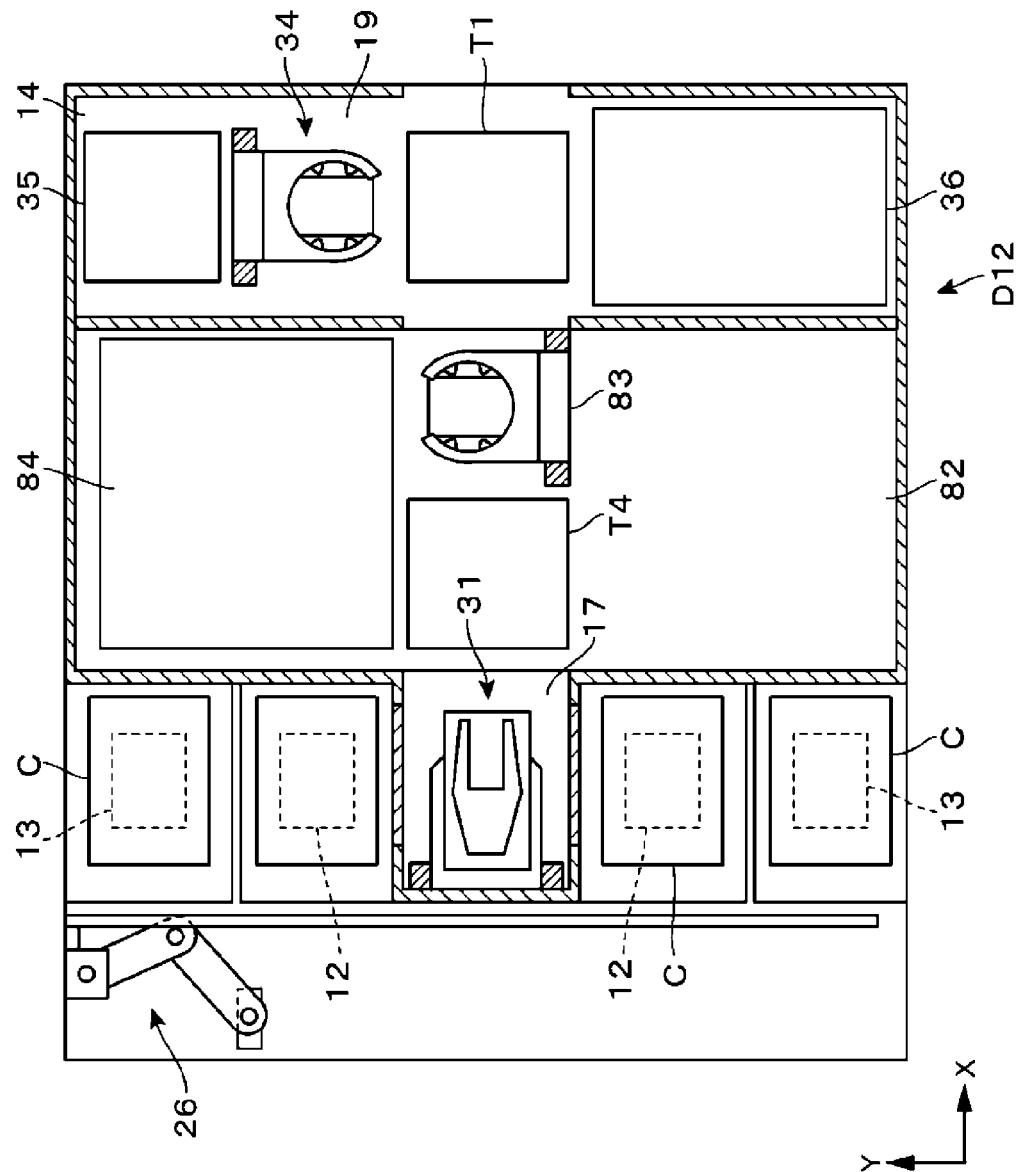
FIG. 17 is a plan view illustrating another modification of the carrier block.

The plan view of FIG. 17 illustrates a carrier block D12, which is a modification of the carrier block D1. Schematically speaking, the carrier block D12 is configured as follows: the carrier block D1 is separated left and right at the boundary between the transfer region 17 and the space 19 of the carrier block D1, and a region 82 including a module and a transfer mechanism is formed therebetween. Thus, it may be seen that a separate block is interposed therebetween. In the region 82, a module stack T4 having a plurality of TRSs is provided at the left side in the central portion in the front-rear direction. A transfer mechanism 83 configured similarly to the transfer mechanism 34 or the like is provided to be interposed between the module stacks T1 and T4. An inspection module 84 is provided on the rear side of the module stack T4 and the transfer mechanism 83 in a plan view. The transfer mechanism 83 delivers the wafers W between the module stacks T1 and T4 and the inspection module 84. Then, the transfer mechanism 31 delivers the wafers W to the module stack T4 instead of the module stack T1.

Therefore, when transferring the wafer W from the carrier C to the module stack T1, the wafer W passes through the module stack T4 and the transfer mechanism 83 in this order. When transferring the wafer W from the module stack T1 to the carrier C, the wafer W passes through the transfer mechanism 83 and the module stack T4 in this order. The inspection module 84 may be for inspection before or after processing in the processing block. When inspecting the wafer W before being processed, the wafer W is transferred to the inspection module 84 while the wafer W is being transferred from the module stack T4 to the module stack T1. When inspecting a processed wafer W, the wafer W is transferred to the inspection module 84 while the wafer W is being transferred from the module stack T1 to the module stack T4. As described above, a configuration may be adopted in which the transfer of the wafers W between the transfer mechanism 31, which is a first substrate transfer mechanism, and the module stack T1, which corresponds to a plurality of substrate placement parts arranged in the vertical direction, may be performed via the transfer mechanism 83 (a third substrate transfer mechanism) different from the transfer mechanism 31.

In addition, in the coating/developing apparatus 1, the upper processing block may be used as a forward route of the wafer W, and the lower processing block may be used as a return route of the wafer W. Specifically, for example, formation of an antireflection film is not performed in the apparatus, and the resist film forming module 49 is provided as a liquid processing module for each of the upper processing blocks 2B and 2D. In addition, developing modules 41 are installed as liquid processing modules of the lower processing blocks 2A and 2C, respectively. A resist pattern may be formed by transferring the wafer W between blocks along a transfer route opposite to the above-described transfer route and sequentially performing formation, exposure, and development of a resist.

Therefore, the shuttle is not limited to forming the rearward route. For the carrier block D1 as well, the shuttle is not limited to the configuration in which the wafer W is delivered to a shuttle TRS that forms the rearward route. In addition, shuttles may also be provided in each of the lower processing blocks 2A and 2C. For example, the liquid processing modules of these processing blocks 2A and 2C are both resist film forming modules 49, and a shuttle may be used to transfer wafers W such that the wafers W are processed in the resist film forming module 49 of one of the processing blocks.

In addition, liquid processing performed in the apparatus is not limited to the above examples, and may include the formation of an insulating film by applying a chemical liquid, the formation of a protective film for front surface protection of a resist film by applying a chemical liquid, the application of adhesive for bonding wafers W to each other, or the like. In addition, a cleaning process in which the front surface or the rear surface of the wafer W is supplied with a cleaning liquid may be performed. Therefore, the substrate processing apparatus of the present technology is not limited to being a coating/developing apparatus.

In addition, the lower processing block and the upper processing block may not be connected to each other by the interface block D4. A specific description will be given with reference to the schematic view of the substrate processing apparatus 8 in FIG. 18. In FIG. 18, the lower processing block and the upper processing block are denoted by G1 and G2, respectively. It is assumed that the module stack T1 includes TRS21 to TRS23. The TRS21 is for delivery to the carrier C. The wafers W are transferred between the carrier C and the TRS21 by a transfer mechanism 31. The TRS22 and the TRS23 are for delivery to the lower processing block G1 and the upper processing block G2, respectively. The wafers W are transferred between the TRS21 and the TRS22 and between TRS21 and TRS23 by the transfer mechanisms 34, respectively. The wafers W transferred from the carrier C via the TRS21 and loaded into the lower processing block G1 and the upper processing block G2 from the TRS22 and TRS23, respectively, are returned to the carrier C from the TRS22 and TRS23 via the TRS21 after processing. That is, the apparatus may be configured such that the wafers W are processed in only one of the lower processing block and the upper processing block and returned to the carrier C.

In addition, each of the lower processing block and the upper processing block is not limited to including two processing blocks arranged in the left-right direction, and may include one processing block. Furthermore, each of the lower processing block and the upper processing block may include a plurality of (three or more) processing blocks arranged in the left-right direction, and the wafers W may be transferred between the processing blocks arranged in the left-right direction. The processing blocks are not limited to being stacked one above another vertically, and the carrier block D1 may be connected to only one processing block.

In each processing block, the liquid processing module is located on the front side and the processing module stack 43 is located on the rear side, but this layout may be reversed in the front-rear direction. In addition, in the carrier block D1, the layout of the transfer mechanisms 31 and 34 and each stage for the carrier C may be reversed in the front-rear direction. The arrangement of the carrier block D1 and other blocks may be reversed in the left-right direction. Regarding the TRS and the SCPL constituting the module stack T1, the heights thereof may be appropriately changed, and the stacking order thereof may be changed as long as the wafers W can be transferred within the apparatus.

The hydrophobizing module 35 may be disposed to overlap the TRS and the SCPL of the module stack T1. However, by disposing a large number of TRSs and SCPLs on the module stack T1 and placing the wafers W thereon, it is possible to perform quick delivery of the wafers W between the carrier block D1 and the first processing block D2 and between the carriers C and the carrier block D1. Therefore, it is preferable to dispose the hydrophobizing modules 35 on the rear side of the module stack T1 as described above.

Figure 11:
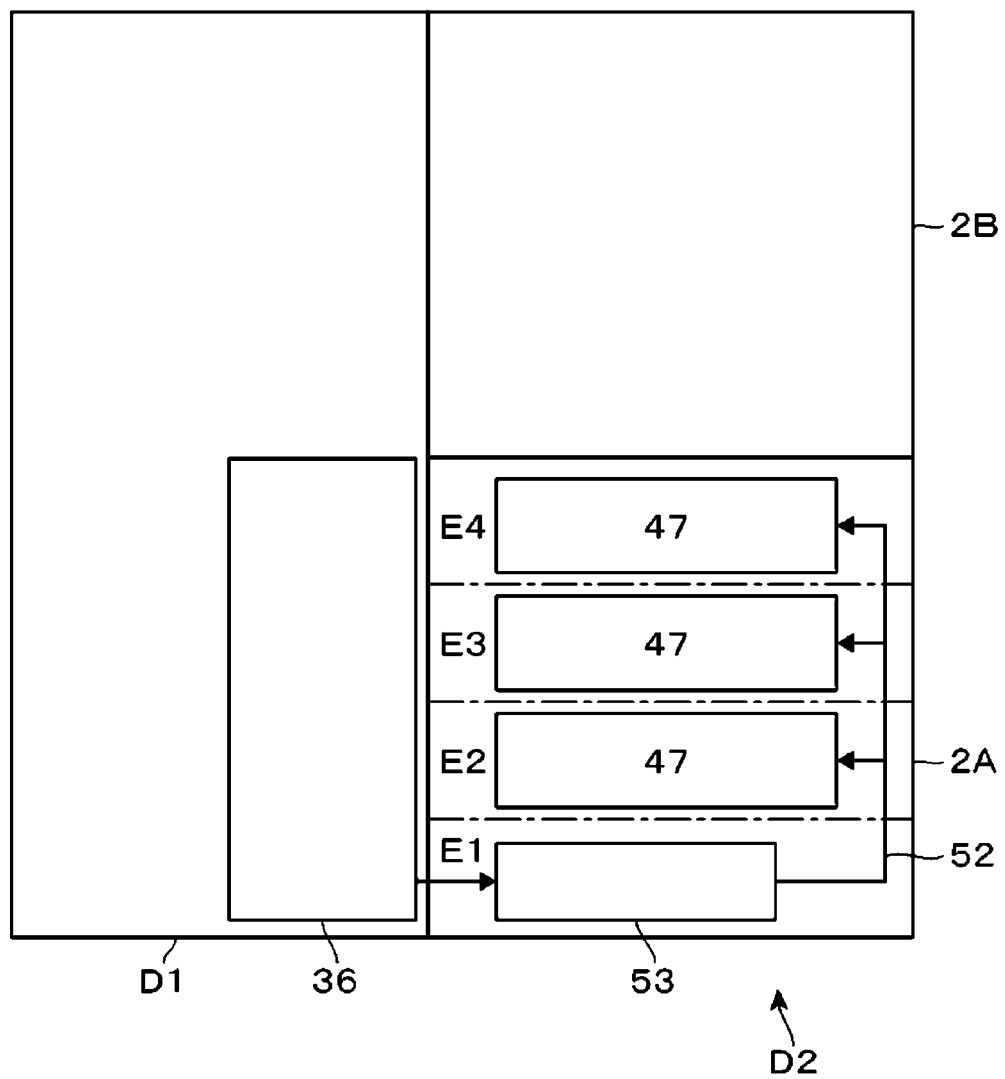
FIG. 11 is a schematic front view of the carrier block and the processing block.

In FIG. 11, it has been described that the bottle in the chemical liquid storage region 36 is for liquid processing in the lower processing block 2A, the bottle for liquid processing in the processing block 2B may also be provided in the chemical liquid storage region 36 depending on the liquid processing performed in the upper processing block 2B. Even if the bottle of the processing block 2B is installed in the chemical liquid storage region 36 in this way, the same effect as in the case of installing the bottle of the processing block 2A in the chemical liquid storage region 36 is exhibited.

According to the present disclosure, it is possible to increase throughput and reduce an occupied floor space in a substrate processing apparatus.

It should be noted that the embodiments disclosed herein are exemplary in all respects and are not restrictive. The above-described embodiments may be omitted, replaced, modified, and combined in various forms without departing from the scope and spirit of the appended claims.

What is claimed is:

1. A substrate processing apparatus comprising:
a carrier block including a plurality of carrier placement parts on each of which a carrier configured to receive a substrate is placed to perform a loading/unloading of the substrate with respect to the carrier;
a processing block provided on one of left and right sides of the carrier block to process the substrate;
a first carrier placement part and a second carrier placement part included in the plurality of carrier placement parts and provided side by side in a front-rear direction in a plan view, wherein at least one of the first carrier placement part or the second carrier placement part is at least one substrate loading/unloading carrier placement part;
a plurality of substrate placement parts provided to be arranged step by step in a vertical direction on one of left and right sides of a substrate transfer region formed between the first carrier placement part and the second carrier placement part in the plan view, wherein the substrate is placed on each of the plurality of substrate placement parts;
a first substrate transfer mechanism provided in the substrate transfer region and configured to rotate around a vertical axis so as to deliver the substrate between the carrier of the first carrier placement part and a first substrate placement part included in the plurality of substrate placement parts; and
a second substrate transfer mechanism configured to move upward and downward so as to deliver the substrate between the first substrate placement part and a second substrate placement part included in the plurality of substrate placement parts, wherein the substrate is placed on the second substrate placement part to be delivered to the processing block,
wherein the plurality of carrier placement parts include a third carrier placement part on which the carrier is placed in a third orientation so as to perform the loading/unloading of the carrier with respect to the carrier block,
the substrate loading/unloading carrier placement part is configured to place the carrier thereon in a fourth orientation different from the third orientation so that an opening provided in the carrier and through which the substrate is loaded and unloaded faces either a front side or a rear side on which the first substrate transfer mechanism is located, and
the substrate processing apparatus further comprises an orientation changing mechanism configured to change an orientation of the carrier between the third orientation and the fourth orientation.

2. The substrate processing apparatus of claim 1, wherein each of the first carrier placement part and the second carrier placement part is the at least one substrate loading/unloading carrier placement part, and
the first substrate transfer mechanism is configured to rotate to be in a first orientation for delivering the substrate to the carrier on the first carrier placement part and a second orientation for delivering the substrate to the carrier on the second carrier placement part, wherein the second orientation is opposite to the first orientation.

3. The substrate processing apparatus of claim 1, further comprising: a carrier transfer mechanism configured to transfer the carrier between the plurality of carrier placement parts,
wherein the orientation changing mechanism corresponds to the carrier transfer mechanism.

4. The substrate processing apparatus of claim 3, wherein the plurality of carrier placement parts include a standby carrier placement part configured to make the carrier stand by, in addition to the at least one substrate loading/unloading carrier placement part and the third carrier placement part, and on each of the at least one substrate loading/unloading carrier placement part and the standby carrier placement part, the carrier is placed while being aligned in the front-rear direction in a state in which the opening faces either the front side or the rear side.

5. The substrate processing apparatus of claim 1, wherein the at least one substrate loading/unloading carrier placement part includes a plurality of substrate loading/unloading carrier placement parts provided in the vertical direction, and the first substrate transfer mechanism is configured to move upward and downward to be shared by the plurality of substrate loading/unloading carrier placement parts.

6. The substrate processing apparatus of claim 1, wherein the processing block includes a lower processing block and an upper processing block stacked one above another, wherein each of the lower processing block and the upper processing block includes a first processing module configured to process the substrate and a main transfer mechanism configured to transfer the substrate to the first processing module, and the second substrate placement part includes a lower substrate placement part and an upper substrate placement part configured to deliver the substrate to the main transfer mechanism of the lower processing block and the main transfer mechanism of the upper processing block, respectively.

7. The substrate processing apparatus of claim 6, wherein a side where the plurality of substrate placement parts are positioned is a front side with respect to the second substrate transfer mechanism, the substrate is delivered by the second substrate transfer mechanism, and a second processing module configured to perform a gas processing on the substrate is provided on a rear side of the second substrate transfer mechanism.

8. The substrate processing apparatus of claim 6, wherein at least one of the upper processing block or the lower processing block includes a first processing block and a second processing block arranged in a left-right direction and each of which includes the first processing module, the main transfer mechanism, and a bypass transfer mechanism configured to transfer the substrate to a downstream side of a transfer path without passing through the first processing module, in the first processing block positioned on a side of the carrier block among the first processing block and the second processing block, the substrate is delivered between the bypass transfer mechanism in the first processing block and the second substrate transfer mechanism, and in the second processing block positioned to be spaced apart from the carrier block among the first processing block and the second processing block, the substrate is delivered between the bypass transfer mechanism in the second processing block, and the main transfer mechanism in the first processing block.

9. A substrate processing apparatus comprising:
a carrier block including a plurality of carrier placement parts on each of which a carrier configured to receive a substrate is placed to perform a loading/unloading of the substrate with respect to the carrier;
a processing block provided on one of left and right sides of the carrier block to process the substrate;
a first carrier placement part and a second carrier placement part included in the plurality of carrier placement parts and provided side by side in a front-rear direction in a plan view, wherein at least one of the first carrier placement part or the second carrier placement part is at least one substrate loading/unloading carrier placement part;
a plurality of substrate placement parts provided to be arranged step by step in a vertical direction on one of left and right sides of a substrate transfer region formed between the first carrier placement part and the second carrier placement part in the plan view, wherein the substrate is placed on each of the plurality of substrate placement parts;
a first substrate transfer mechanism provided in the substrate transfer region and configured to rotate around a vertical axis so as to deliver the substrate between the carrier of the first carrier placement part and a first substrate placement part included in the plurality of substrate placement parts; and
a second substrate transfer mechanism configured to move upward and downward so as to deliver the substrate between the first substrate placement part and a second substrate placement part included in the plurality of substrate placement parts, wherein the substrate is placed on the second substrate placement part to be delivered to the processing block,
wherein the processing block includes a lower processing block and an upper processing block stacked one above another, wherein each of the lower processing block and the upper processing block includes a first processing module configured to process the substrate and a main transfer mechanism configured to transfer the substrate to the first processing module,
the second substrate placement part includes a lower substrate placement part and an upper substrate placement part configured to deliver the substrate to the main transfer mechanism of the lower processing block and the main transfer mechanism of the upper processing block, respectively,
the first processing module of at least one of the lower processing block or the upper processing block includes a liquid processing module configured to supply a processing liquid to the substrate, and
the substrate processing apparatus further comprises: a storage part provided on an opposite side to a side on which the second substrate transfer mechanism is provided in the front-rear direction with respect to the plurality of substrate placement parts in the plan view and configured to store the processing liquid to supply the processing liquid to the liquid processing module.

10. A substrate processing apparatus comprising:
a carrier block including a plurality of carrier placement parts on each of which a carrier configured to receive a substrate is placed to perform a loading/unloading of the substrate with respect to the carrier;
a processing block provided on one of left and right sides of the carrier block to process the substrate;
a first carrier placement part and a second carrier placement part included in the plurality of carrier placement parts and provided side by side in a front-rear direction in a plan view, wherein at least one of the first carrier placement part or the second carrier placement part is at least one substrate loading/unloading carrier placement part;
a plurality of substrate placement parts provided to be arranged step by step in a vertical direction on one of left and right sides of a substrate transfer region formed between the first carrier placement part and the second carrier placement part in the plan view, wherein the substrate is placed on each of the plurality of substrate placement parts;
a first substrate transfer mechanism provided in the substrate transfer region and configured to rotate around a vertical axis so as to deliver the substrate between the carrier of the first carrier placement part and a first substrate placement part included in the plurality of substrate placement parts;
a second substrate transfer mechanism configured to move upward and downward so as to deliver the substrate between the first substrate placement part and a second substrate placement part included in the plurality of substrate placement parts, wherein the substrate is placed on the second substrate placement part to be delivered to the processing block; and
an inspection module provided to overlap the first carrier placement part or the second carrier placement part in the plan view and configured to inspect the substrate,
wherein the first substrate transfer mechanism moves upward and downward to be shared by the substrate loading/unloading carrier placement part and the inspection module.

11. The substrate processing apparatus of claim 9, wherein each of the first carrier placement part and the second carrier placement part is the at least one substrate loading/unloading carrier placement part, and
the first substrate transfer mechanism is configured to rotate to be in a first orientation for delivering the substrate to the carrier on the first carrier placement part and a second orientation for delivering the substrate to the carrier on the second carrier placement part, wherein the second orientation is opposite to the first orientation.

12. The substrate processing apparatus of claim 9, wherein the plurality of carrier placement parts include a third carrier placement part on which the carrier is placed in a third orientation so as to perform the loading/unloading of the carrier with respect to the carrier block,
the substrate loading/unloading carrier placement part is configured to place the carrier thereon in a fourth orientation different from the third orientation so that an opening provided in the carrier and through which the substrate is loaded and unloaded faces either a front side or a rear side on which the first substrate transfer mechanism is located, and
the substrate processing apparatus further comprises an orientation changing mechanism configured to change an orientation of the carrier between the third orientation and the fourth orientation.

13. The substrate processing apparatus of claim 12, further comprising: a carrier transfer mechanism configured to transfer the carrier between the plurality of carrier placement parts,
wherein the orientation changing mechanism corresponds to the carrier transfer mechanism.

14. The substrate processing apparatus of claim 13, wherein the plurality of carrier placement parts include a standby carrier placement part configured to make the carrier stand by, in addition to the at least one substrate loading/unloading carrier placement part and the third carrier placement part, and
on each of the at least one substrate loading/unloading carrier placement part and the standby carrier placement part, the carrier is placed while being aligned in the front-rear direction in a state in which the opening faces either the front side or the rear side.

15. The substrate processing apparatus of claim 9, wherein the at least one substrate loading/unloading carrier placement part includes a plurality of substrate loading/unloading carrier placement parts provided in the vertical direction, and
the first substrate transfer mechanism is configured to move upward and downward to be shared by the plurality of substrate loading/unloading carrier placement parts.

16. The substrate processing apparatus of claim 10, wherein each of the first carrier placement part and the second carrier placement part is the at least one substrate loading/unloading carrier placement part, and
the first substrate transfer mechanism is configured to rotate to be in a first orientation for delivering the substrate to the carrier on the first carrier placement part and a second orientation for delivering the substrate to the carrier on the second carrier placement part, wherein the second orientation is opposite to the first orientation.

17. The substrate processing apparatus of claim 10, wherein the plurality of carrier placement parts include a third carrier placement part on which the carrier is placed in a third orientation so as to perform the loading/unloading of the carrier with respect to the carrier block,
the substrate loading/unloading carrier placement part is configured to place the carrier thereon in a fourth orientation different from the third orientation so that an opening provided in the carrier and through which the substrate is loaded and unloaded faces either a front side or a rear side on which the first substrate transfer mechanism is located, and
the substrate processing apparatus further comprises an orientation changing mechanism configured to change an orientation of the carrier between the third orientation and the fourth orientation.

18. The substrate processing apparatus of claim 17, further comprising a carrier transfer mechanism configured to transfer the carrier between the plurality of carrier placement parts,
wherein the orientation changing mechanism corresponds to the carrier transfer mechanism.

19. The substrate processing apparatus of claim 18, wherein the plurality of carrier placement parts include a standby carrier placement part configured to make the carrier stand by, in addition to the at least one substrate loading/unloading carrier placement part and the third carrier placement part, and
on each of the at least one substrate loading/unloading carrier placement part and the standby carrier placement part, the carrier is placed while being aligned in the front-rear direction in a state in which the opening faces either the front side or the rear side.

20. The substrate processing apparatus of claim 10, wherein the at least one substrate loading/unloading carrier placement part includes a plurality of substrate loading/unloading carrier placement parts provided in the vertical direction, and the first substrate transfer mechanism is configured to move upward and downward to be shared by the plurality of substrate loading/unloading carrier placement parts.

* * * * *